(12) United States Patent
Nakanishi et al.

(10) Patent No.: US 11,593,286 B2
(45) Date of Patent: Feb. 28, 2023

(54) MEMORY SYSTEM AND INFORMATION PROCESSING SYSTEM

(71) Applicant: Kioxia Corporation, Tokyo (JP)

(72) Inventors: Keiri Nakanishi, Kawasaki (JP);
Kazuhiro Hiwada, Kamakura (JP);
Youhei Fukazawa, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/345,651

(22) Filed: Jun. 11, 2021

(65) Prior Publication Data
US 2022/0171724 A1    Jun. 2, 2022

(30) Foreign Application Priority Data

Nov. 30, 2020    (JP) .............................. JP2020-198376

(51) Int. Cl.
*G06F 13/18*    (2006.01)
*G06F 9/54*    (2006.01)
*G06F 13/16*    (2006.01)

(52) U.S. Cl.
CPC .............. *G06F 13/18* (2013.01); *G06F 9/542* (2013.01); *G06F 13/1642* (2013.01); *G06F 13/1673* (2013.01)

(58) Field of Classification Search
None
See application file for complete search history.

(56) References Cited

U.S. PATENT DOCUMENTS

| 10,002,081 | B2 | 6/2018 | Guilford et al. |
| 10,270,464 | B1 | 4/2019 | Guilford et al. |
| 10,303,402 | B2 | 5/2019 | Xie et al. |
| 10,911,064 | B1 * | 2/2021 | Xie ...................... H03M 7/6011 |
| 2022/0139502 | A1 * | 5/2022 | Rizk ...................... G16B 50/50 341/50 |

FOREIGN PATENT DOCUMENTS

JP    6277797 B2    2/2018

OTHER PUBLICATIONS

NVM Express, Inc., "NVM Express Base Specification", Revision 1.4a, https://nvmexpress.org/wpcontent/uploads/NVM-Express-1_4a-2020.03.09-Ratified_pdf, Mar. 9, 2020, 405 pages.

* cited by examiner

*Primary Examiner* — Charles J Choi
(74) *Attorney, Agent, or Firm* — Oblon, McClelland, Maier & Neustadt, L.L.P.

(57) ABSTRACT

According to one embodiment, a memory system includes a first compression unit, a second compression unit, a non-volatile memory, a first decoding unit, a conversion unit and an output unit. The first compression unit is configured to output second data obtained by compressing first data. The second compression unit is configured to output third data obtained by compressing the second data. Fourth data based on the third data is written to the non-volatile memory. The first decoding unit is configured to decode the third data based on the fourth data to the second data. The conversion unit is configured to acquire fifth data by converting a format of the second data. The output unit is configured to output the fifth data to a host.

23 Claims, 16 Drawing Sheets

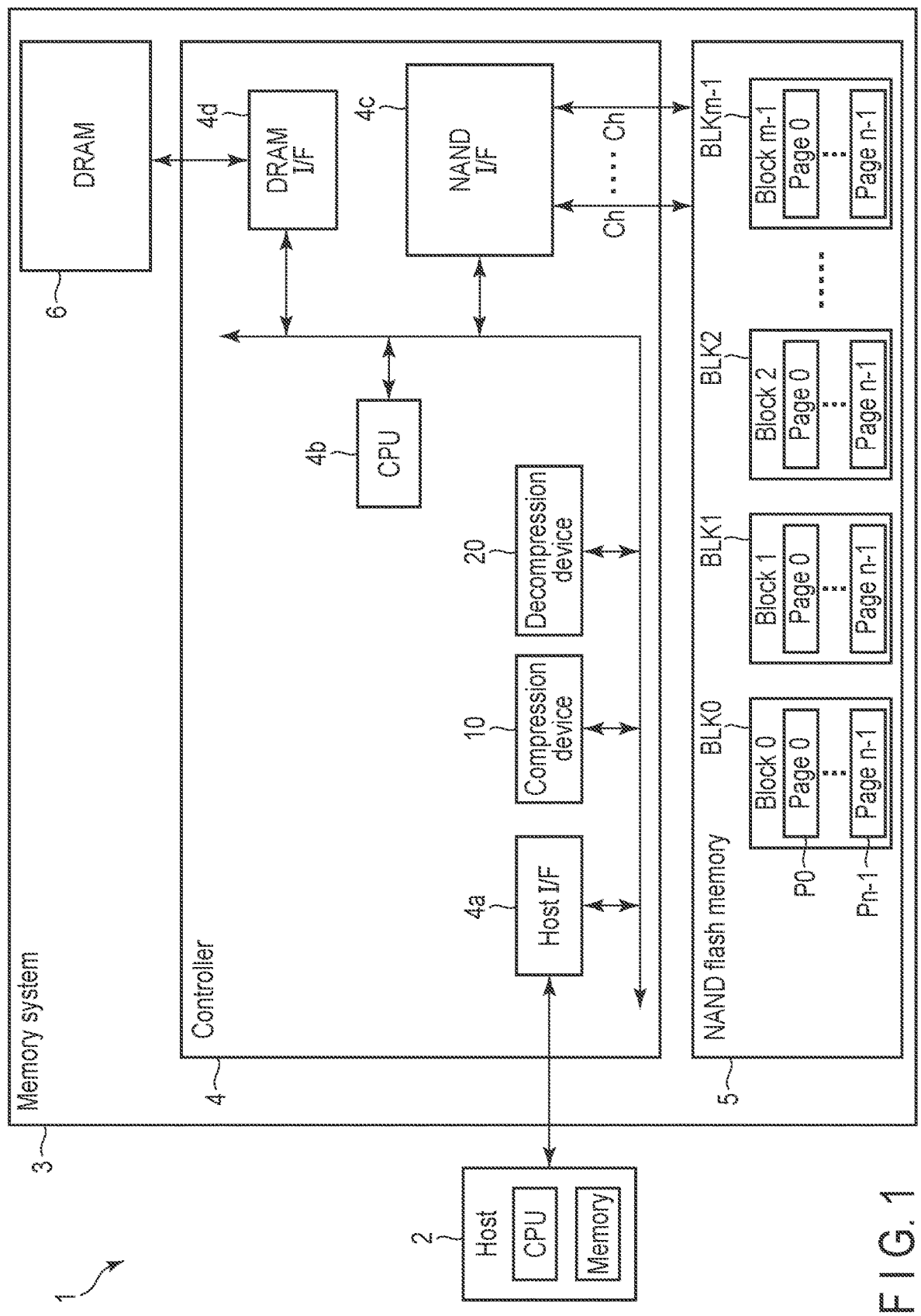
F I G. 1

Three characters match fourth characters before in history buffer

Output:(match position, match length)=(4,3)

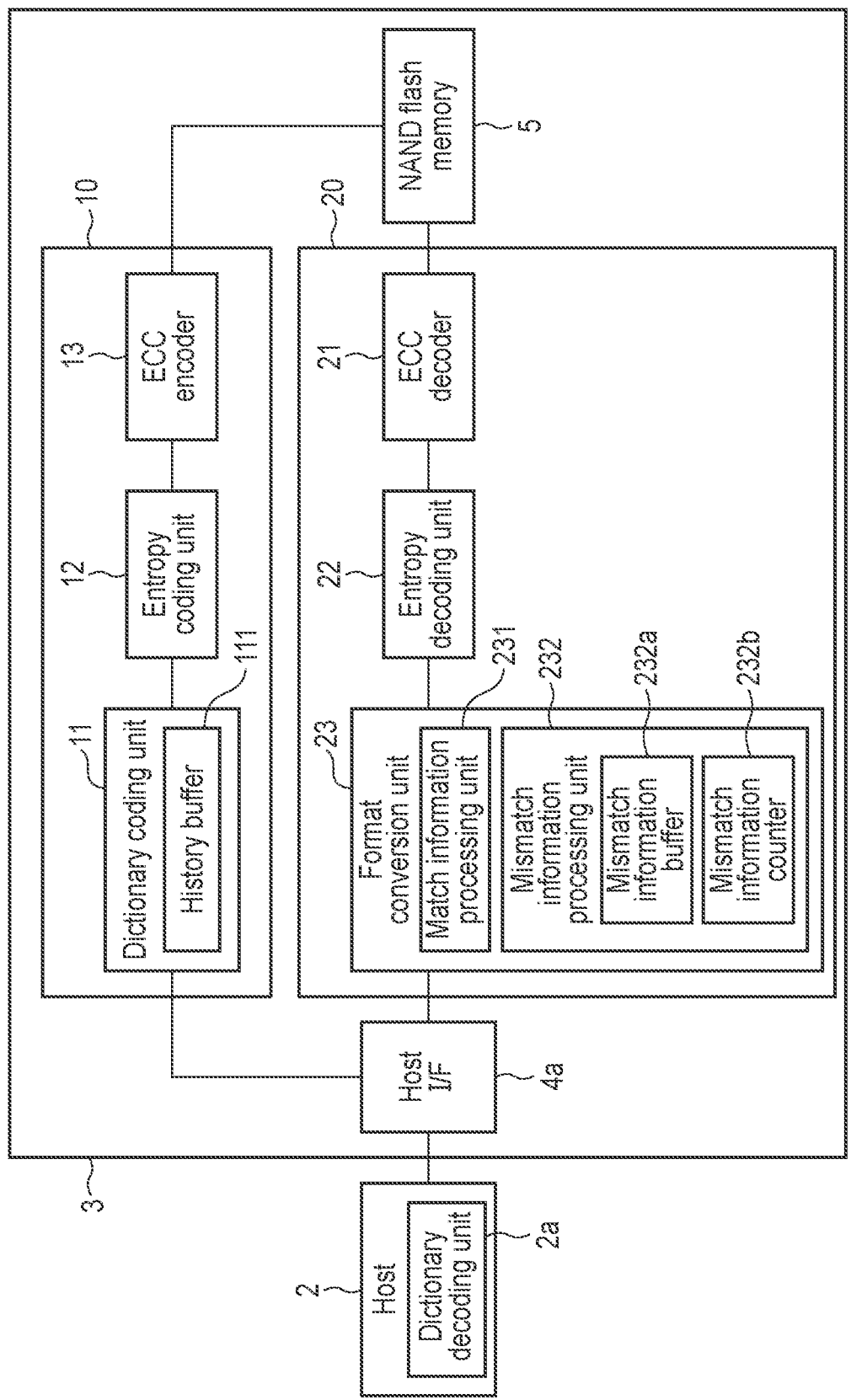
F I G. 3

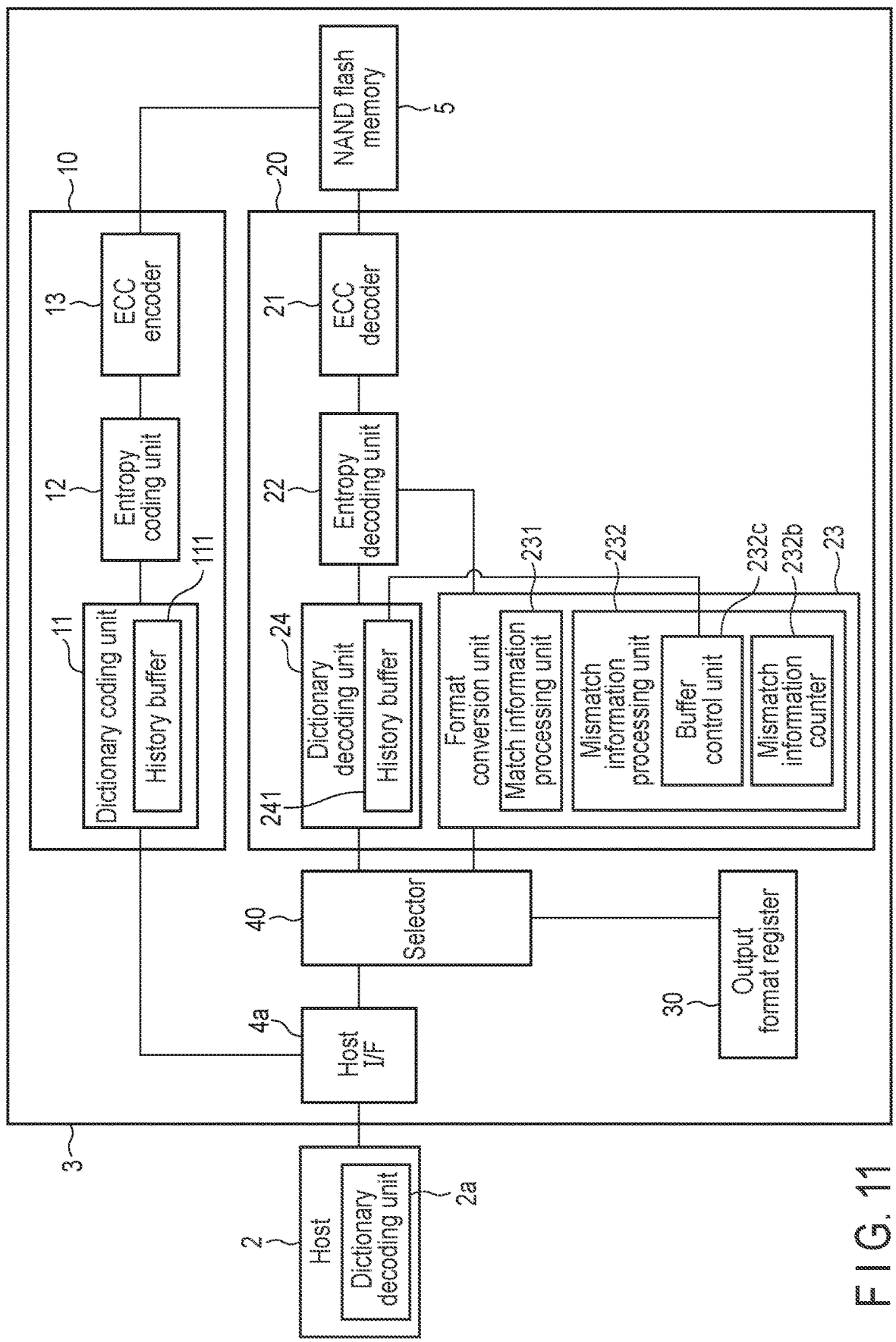
F I G. 11

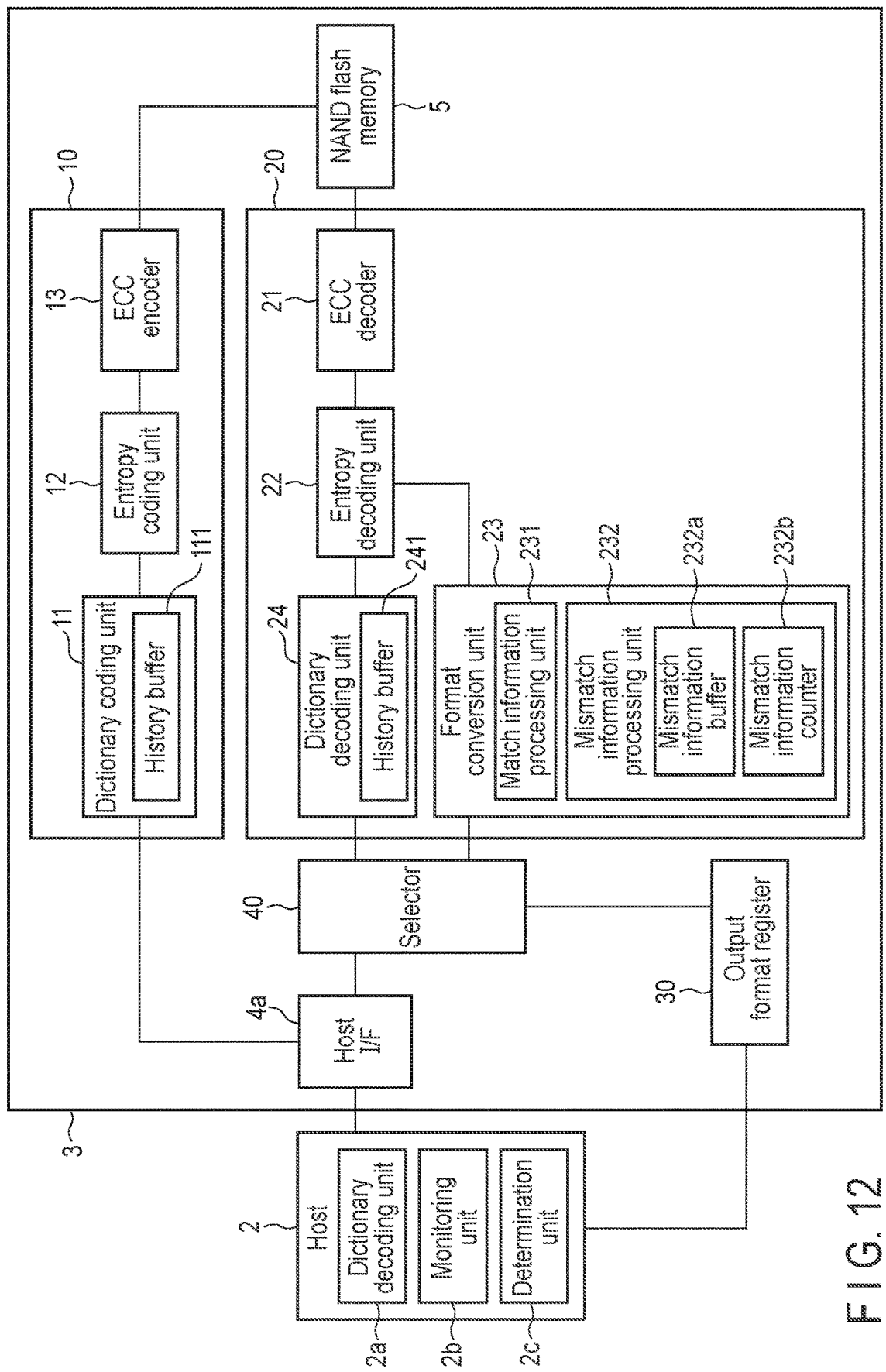
F I G. 12

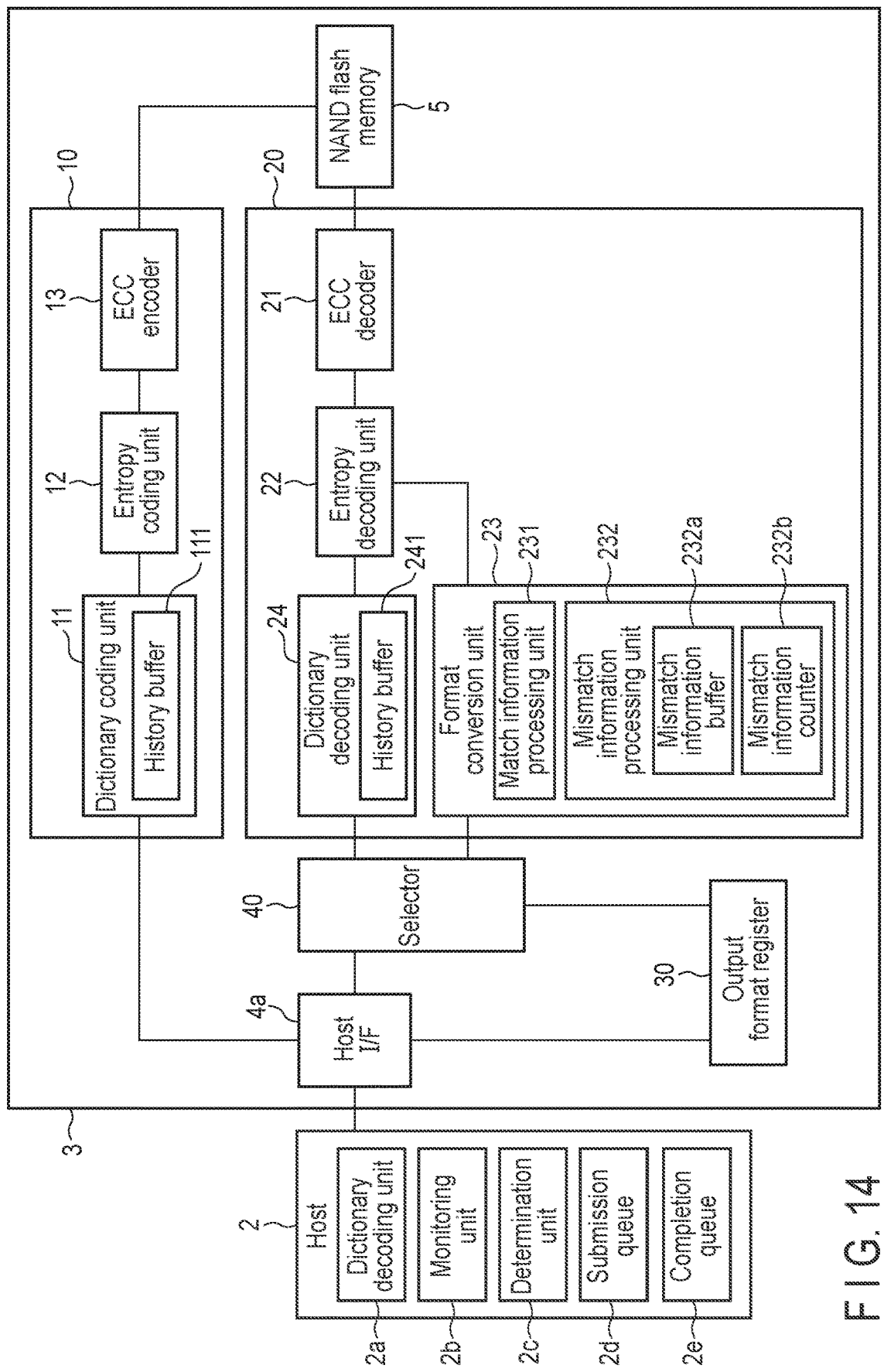
F I G. 14

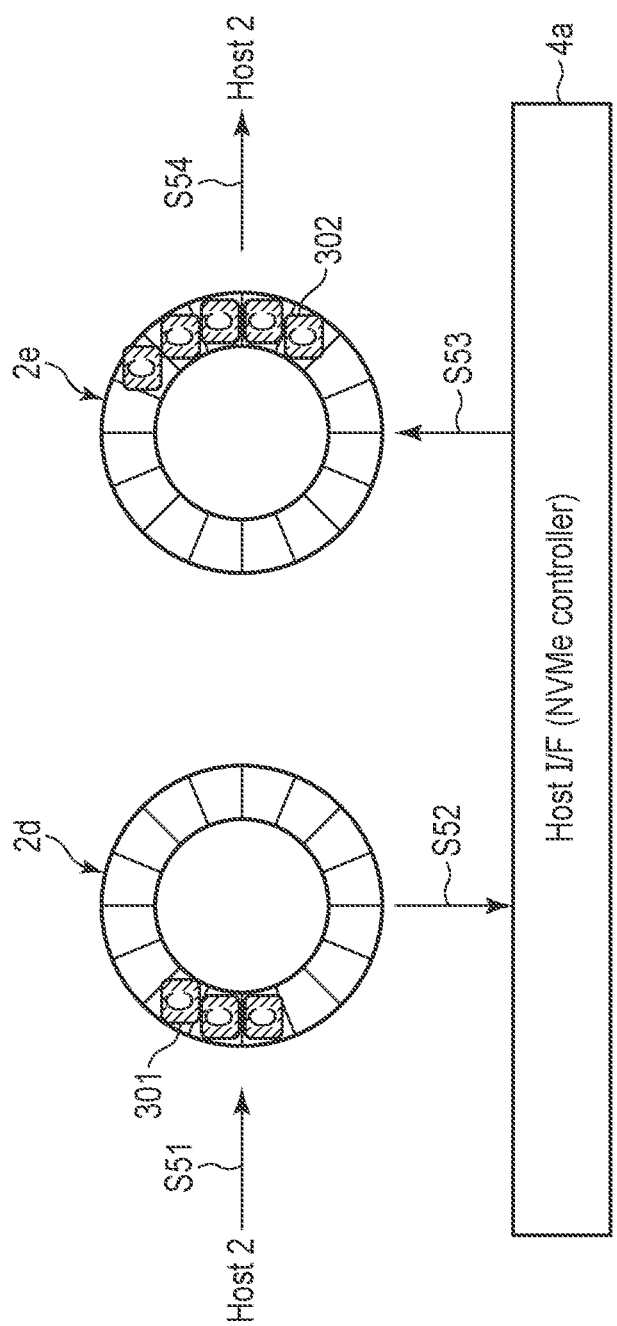
F I G. 15

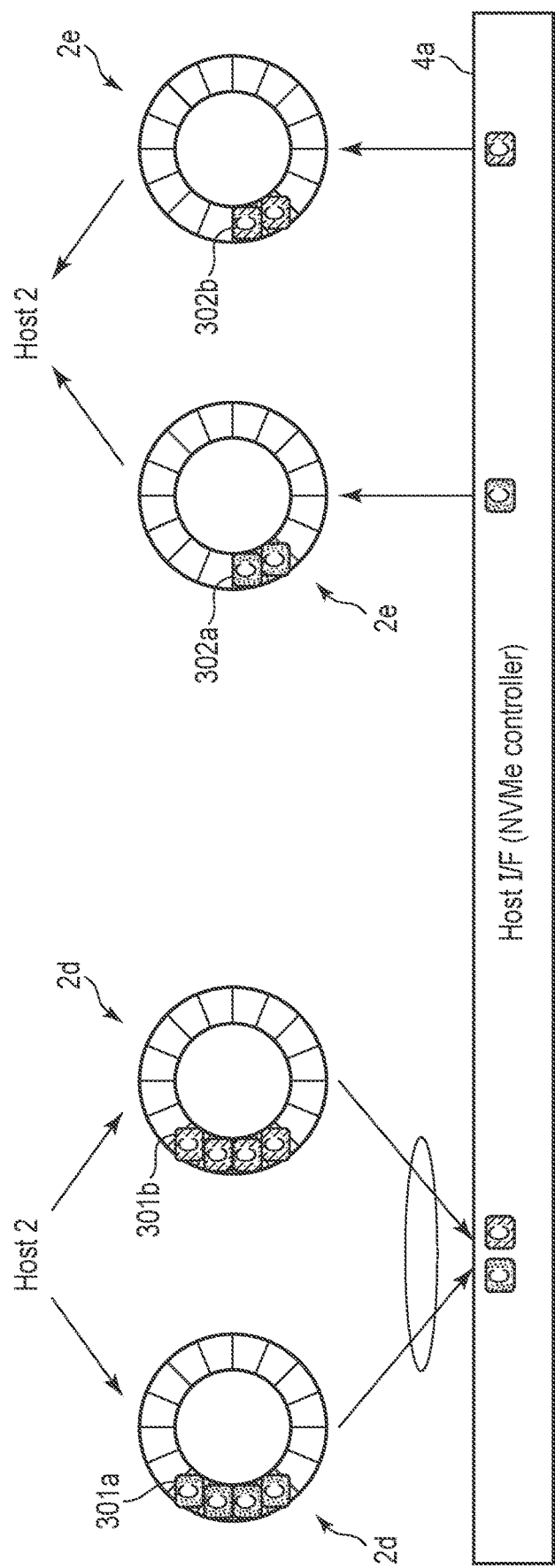
F I G. 16

MEMORY SYSTEM AND INFORMATION PROCESSING SYSTEM

CROSS-REFERENCE TO RELATED APPLICATIONS

This application is based upon and claims the benefit of priority from Japanese Patent Application No. 2020-198376, filed Nov. 30, 2020, the entire contents of which are incorporated herein by reference.

FIELD

Embodiments described herein relate generally to a memory system and an information processing system.

BACKGROUND

In recent years, a memory system having a function of compressing and decompressing data has been known in order to effectively utilize a memory area. In such a memory system, when a write command is issued from a host connected to the memory system, the data can be compressed and written to the non-volatile memory. On the other hand, when a read command is issued from the host, the data (compressed data) read from the non-volatile memory can be decompressed and output to the host.

However, when the above-described memory system is used for a database or the like with a high frequency of the read command, a bus bandwidth usage rate for outputting the decompressed data to the host becomes high (that is, a bus bandwidth becomes a bottleneck). Therefore, the performance of the entire information processing system including the memory system and the host may not be improved.

BRIEF DESCRIPTION OF THE DRAWINGS

FIG. 1 is a block diagram schematically illustrating an example of a hardware configuration of an information processing system according to a first embodiment.

FIG. 3 is a block diagram illustrating an example of a functional configuration of the information processing system according to the first embodiment.

FIG. 11 is a block diagram illustrating an example of a functional configuration of the information processing system according to a third embodiment.

FIG. 12 is a block diagram illustrating an example of a functional configuration of the information processing system according to a fourth embodiment.

FIG. 14 is a block diagram illustrating an example of a functional configuration of the information processing system according to a fifth embodiment.

FIG. 15 is a diagram for describing an operation of the information processing system using a submission queue and a completion queue in the fifth embodiment.

FIG. 16 is a diagram for describing a modified example of the fifth embodiment.

DETAILED DESCRIPTION

Figure 2:
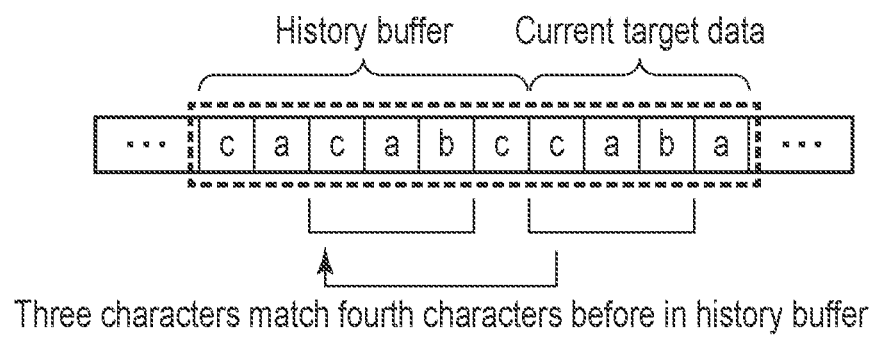
FIG. 2 is a diagram for describing an outline of dictionary coding in the first embodiment.

Various embodiment will be described hereinafter with reference to the accompanying drawings.

In general, according to one embodiment, a memory system connectable to a host includes a first compression unit, a second compression unit, a non-volatile memory, a first decoding unit, a conversion unit and an output unit. The first compression unit is configured to output second data obtained by compressing first data specified in the host by a first compression method. The second compression unit is configured to output third data obtained by compressing second data output from the first compression unit by a second compression method different from the first compression method. Fourth data based on the third data output from the second compression unit is written to the non-volatile memory. The first decoding unit is configured to decode the third data based on the fourth data written to the non-volatile memory to the second data. The conversion unit is configured to acquire fifth data by converting a format of the second data decoded by the first decoding unit. The output unit is configured to output the fifth data to the host.

First Embodiment

FIG. 1 is a block diagram schematically illustrating an example of a hardware configuration of an information processing system according to a first embodiment. As illustrated in FIG. 1, an information processing system 1 includes a host 2 and a memory system 3.

The host 2 is an information processing device that operates as a host device for the memory system 3, and is realized as, for example, a personal computer, a server device, or the like, but may be another information processing device. The host 2 includes, for example, a CPU, a memory, and the like.

The memory system 3 is a semiconductor storage device configured to write data (user data) to a non-volatile memory and read data from the non-volatile memory. The memory system can be realized as, for example, a solid state drive (SSD).

The memory system 3 is configured to be connectable to the host 2 via a system bus such as a PCI Express bus, and includes a controller 4, a NAND flash memory 5, a dynamic random access memory (DRAM) 6, and the like.

The controller 4 has a function of controlling an operation of the memory system 3. The controller 4 includes a host interface (I/F) 4a, a CPU 4b, a NAND interface (I/F) 4c, a DRAM interface (I/F) 4d, and the like. Note that the host interface 4a, the CPU 4b, the NAND interface 4c, and the DRAM interface 4d are connected to each other via, for example, a bus.

The host interface 4a is a host interface circuit configured to execute communication with the host 2. The host interface 4a may be, for example, a PCI Express controller or the like. The host interface 4a receives various commands (requests) issued from the host 2.

The CPU 4b is a processor configured to control the host interface 4a, the NAND interface 4c, and the DRAM interface 4d. The CPU 4b loads a control program (firmware) from a NAND flash memory 5 or a read only memory (ROM) (not illustrated) into a DRAM 6 in response to power-on of the memory system 3, and executes the control program to perform various processes. Specifically, the CPU 4b executes processes on various commands issued from host 2. Note that some or all of the processes on the command issued from the host 2 may be executed by dedicated hardware in the controller 4.

The NAND interface 4c is a memory control circuit configured to control the NAND flash memory 5 under the control of the CPU 4b.

Further, the controller 4 includes a compression device (compressor) 10 and a decompression device (decompressor) 20.

The compression device 10 compresses the data specified in the write command, for example, when the write command is issued by the host 2. The data (hereinafter referred to as compressed data) compressed in the compression device 10 is written to, for example, the NAND flash memory 5.

For example, when the read command is issued from the host 2, the decompression device 20 reads the compressed data from the NAND flash memory 5 based on the read command and decompresses the compressed data.

The details of the configuration and operation of the compression device 10 and the decompression device 20 in the first embodiment will be described later.

The NAND flash memory 5 is a non-volatile memory and includes a memory cell array including a plurality of memory cells arranged in a matrix. The NAND flash memory 5 may be a NAND flash memory of a two-dimensional structure or a NAND flash memory of a three-dimensional structure.

A memory cell array of the NAND flash memory 5 includes a plurality of blocks BLK0 to BLKm−1. Each of the blocks BLK0 to BLKm−1 is organized by a plurality of pages (here, pages P0 to Pn−1). The blocks BLK0 to BLKm−1 function as erase units. Each of the pages P0 to Pn−1 includes a plurality of memory cells connected to the same word line. The pages P0 to Pn−1 are units of data write operation and data read operation.

Here, the memory system 3 has been described as including the NAND flash memory 5, but the memory system 3 may include, for example, a phase change memory (PCM) or a magnetoresistive random access memory (MRAM) as the non-volatile memory.

The DRAM 6 is a volatile memory, and functions as, for example, a temporary buffer for software executed in the controller 4 (CPU 4b), a temporary buffer for the NAND flash memory 5, or the like.

Here, the memory system 3 is described as including the DRAM 6, but the memory system 3 may include, for example, a static random access memory (SRAM) or the like as the volatile memory.

Although the compression device 10 and the decompression device 20 have been described as being incorporated in the controller 4 in FIG. 1, one or both of the compression device 10 and the decompression device 20 may be provided outside the controller 4.

Here, in the memory system 3 in which general-purpose data such as the SSD described above is written, it is difficult to grasp the type of data to be written in advance, so the data is often compressed by a general-purpose compression method. As a general-purpose compression method, for example, there is a compression method of combining dictionary coding and entropy coding.

Hereinafter, an outline of the dictionary coding will be described with reference to FIG. 2. Here, data (input value) input as a target of the dictionary coding is referred to as a target data, and the target data will be described as, for example, text (character string) data.

Here, the dictionary coding is a coding method of converting target data into a relative reference of data (that is, data input in the past) input as a target of the dictionary coding before the target data.

Therefore, in this dictionary coding, the data previously input is stored in a buffer (hereinafter, referred to as a history buffer) called a dictionary, and data that matches all or part of the target data (forward data) is searched in the history buffer. When data that matches all or part of the target data exists in the history buffer, a match position (matching relative distance indicating a relative distance from the target data) indicating the position of the data and a match length indicating a matched length of a target data and data found from the history buffer are output.

Here, FIG. 2 shows that the current target data is "caba" and " . . . cacabc" is stored in the history buffer as data input in the past. According to the example illustrated in FIG. 2, the target data "caba" (a part thereof) matches two characters "ca" and three characters "cab" in the history buffer. If the longer part of the target data can be replaced with the relative reference, coding efficiency is high, and therefore, the "cab" in the history buffer is selected as data (hereinafter, referred to as buffer data) that at least partially match the target data.

Since the position of the buffer data ("cab") thus searched is four characters before the target data, the above-described match position (matching relative distance from the data to be coded to a matching location) is four. In addition, since the "cab" of the target data and the "cab" of the buffer data match, the above-described match length is three (characters).

That is, in the example illustrated in FIG. 2, a pair (4, 3) of the match position and the match length is output to a subsequent stage as a result of the dictionary coding for the target data "caba".

Note that the above-described target data corresponds to some data (data having a predetermined size) constituting the data (hereinafter referred to as write data) specified in the write command issued from host 2, and in the dictionary coding, a process of consecutively inputting each of the target data constituting the write data from a head of the write data and sequentially coding the input target data is executed.

In this case, a process is repeated by treating a trailing "a" that does not match the buffer data in the target data "caba" illustrated in FIG. 2 as the next target data together with the subsequent data.

In FIG. 2, a case where buffer data that at least partially matches the target data exists in the history buffer has been described, but when the buffer data which at least partially matches the target data is not found in the history buffer, the target data (raw data) is output to the subsequent stage as the result of the result of the dictionary coding.

In the following description, the set of the match position and match length output as the result of the dictionary coding is referred to as match information, and the raw data output as the result of the dictionary coding is referred to as mismatch information.

Although the dictionary coding has been described here, in the entropy coding combined with the dictionary coding as the above-described general-purpose compression method, for example, a process (coding process) of assigning a code corresponding to the appearance frequency of the match information and the mismatch information output as the result of the dictionary coding to the match information and the mismatch information is executed. In the entropy coding, for example, a short code is allocated to the match information and the mismatch information having a high appearance frequency, and a long code is allocated to the match information and the mismatch information having a low appearance frequency.

Note that the entropy coding includes, for example, Huffman coding, but the Huffman coding may be static Huffman coding in which coding is performed using a pre-constructed code tree, or may be dynamic Huffman coding that changes the code tree according to the match information and the mismatch information input as the target. As the entropy coding in the first embodiment, for example, arithmetic coding or the like may be performed.

Here, the data (compressed data) compressed by the compression method of combining the above-described dictionary coding and entropy coding is written to the NAND flash memory 5 (non-volatile memory). When the read command is issued from the host 2, the compressed data is read from the NAND flash memory 5 based on the read command.

Generally, as a response to such a read command, data (hereinafter referred to as decompressed data) decompressed by sequentially performing entropy decoding and dictionary decoding on the compressed data read from the NAND flash memory 5 is output to the host 2. In the first embodiment, the decompressed data refers to data (raw data) in which the above-described dictionary coding and entropy coding are not performed.

However, for example, when the memory system 3 is used for the database or the like in which the frequency of the read command is high, the above-described decompressed data (that is, the data of the original size after decompression) is frequently output (transmitted) from the memory system 3 to the host 2 via the system bus, so the system bus bandwidth usage rate becomes high. In this case, the bus bandwidth (read data bandwidth) between the host 2 and the memory system 3 becomes a bottleneck, and the performance of the entire information processing system 1 (the host 2 and the memory system 3) may not be improved.

On the other hand, for example, the configuration in which the compressed data written to the NAND flash memory 5 is output from the memory system 3 to the host 2 is considered, but in the case of such a configuration, both the entropy decoding and the dictionary decoding (that is, all the decompression process) are performed on the host 2 side and the load on the CPU included in the host 2 becomes high.

Furthermore, the above-described result of the entropy coding includes a variable-length code (symbol) whose code length changes according to the appearance frequency, and in the entropy decoding, it is necessary to process the symbols one by one. Therefore, it is difficult for the CPU (that is, software processing) included in the host 2 to efficiently perform the entropy decoding (that is, the performance of entropy decoding by software is low). On the other hand, the dictionary decoding process may be able to perform high-speed processing with a low load even in the software processing.

Therefore, the first embodiment adopts the configuration in which the data (that is, the compressed data compressed by dictionary coding) after the entropy decoding is performed on the compressed data written to the NAND flash memory 5 is output from the memory system 3 to the host 2.

FIG. 3 is a block diagram illustrating an example of a functional configuration of the information processing system 1 according to the first embodiment. Here, the functional configuration related to the data compression and decompression will be mainly described. In FIG. 3, the NAND interface 4c and the like arranged between the compression device 10 and the decompression device 20 and the NAND flash memory 5 are omitted.

First, the compression device 10 includes a dictionary coding unit 11, an entropy coding unit 12, and an ECC encoder 13.

The dictionary coding unit 11 is connected to the host 2 via the host interface 4a, and acquires (inputs) the write command issued from the host 2. The dictionary coding unit 11 has a history buffer 111 described above, and compresses the write data by performing the dictionary coding on the write data (that is, the data specified on the host 2) based on the acquired write command.

When compressing the write data by the dictionary coding, a part of the write data is set as the target data as described above, and each of the target data consecutively input from the head of the write data is sequentially coded.

In the following description, the match information and the mismatch information (that is, the write data compressed by the dictionary coding unit 11) output by the dictionary coding unit 11 will be referred to as dictionary coded data for convenience. This dictionary coded data has a data structure in which the results (match information and mismatch information) of the dictionary coding performed on each of the target data consecutively input as described above are sequentially arranged from the head.

The entropy coding unit 12 further compresses the dictionary coded data by performing the entropy coding on the dictionary coded data (match information and mismatch information) output by the dictionary coding unit 11. The entropy coding unit 12 outputs the dictionary coded data (hereinafter referred to as entropy coded data) in which the entropy coding has been performed.

The ECC encoder 13 executes a process (hereinafter referred to as ECC encoding process) of generating error correction parity (ECC parity) for the entropy coded data before the entropy coded data is written to the NAND flash memory 5, and allocating the generated ECC parity for the entropy coded data.

The entropy coded data subjected to the ECC encoding process is written to the NAND flash memory 5 as compressed data compressed by the compression device 10. That is, the data based on the entropy coded data output from the entropy coding unit 12 is written to the NAND flash memory 5.

Next, the decompression device 20 includes an ECC decoder 21, an entropy decoding unit 22, and a format conversion unit 23.

The ECC decoder 21 performs a process (hereinafter, ECC decoding process) of detecting an error included in the compressed data based on the parity generated for the compressed data when the compressed data (entropy coded data) is read from the NAND flash memory 5 based on the read command issued from the host 2, for example, and correcting the detected error.

The entropy decoding unit 22 decodes the entropy coded data to dictionary coded data by performing the entropy decoding on the compressed data (entropy coded data) on which the ECC decoding process has been executed. That is, the entropy decoding unit 22 performs the entropy decoding on the entropy coded data based on the data read from the NAND flash memory 5 and generates the dictionary coded data.

Here, in the first embodiment, the dictionary coded data after the entropy decoding is performed is output from the memory system 3 to the host 2, and the dictionary coded data includes each of the above-described match information and mismatch information as a symbol. Since the lengths of the match information and the mismatch information (that is, one symbol) are indefinite, a break (boundary) of the symbol is unclear unless the match information and the mismatch information are cut out from the dictionary coded data. When the dictionary decoding is performed on such dictionary coded data by the software processing, there is a need to perform a process of sequentially cutting out the match information and the mismatch information included in the dictionary coded data and determining whether or not there is the boundary of the symbols, and therefore, it is difficult to speed up.

Therefore, in the first embodiment, the format conversion unit 23 converts the format of the dictionary coded data decoded by the entropy decoding unit 22, and converts the dictionary coded data into a dictionary coded data (hereinafter referred to as "format conversion data") having a predetermined format. The predetermined format of the format conversion data corresponds to a format for a reduction (efficiency) in the dictionary decoding in the above-described software processing.

The format conversion unit 23 sequentially cuts out the match information and the mismatch information included in the dictionary coded data from the head of the dictionary coded data. It is assumed that the match information and the mismatch information included in the dictionary coded data are attached with identification information (for example, a flag or the like) for identifying the match information and the mismatch information, respectively. From this identification information, the format conversion unit 23 can grasp whether the information (match information or mismatch information) cut out from the dictionary coded data is the match information or the mismatch information.

As illustrated in FIG. 3, the format conversion unit 23 includes a match information processing unit 231 and a mismatch information processing unit 232.

When the match information is cut out from the dictionary coded data by the format conversion unit 23, the match information processing unit 231 executes a process of adding additional information regarding the match information. The additional information added to the match information includes, for example, the length of the match information.

When the mismatch information (mismatch character) is cut out from the dictionary coded data by the format conversion unit 23, the mismatch information processing unit 232 executes a process of adding additional information regarding the mismatch information. The additional information added to the mismatch information includes, for example, the number of consecutive pieces of mismatch information when the mismatch information is consecutively arranged with other mismatch information in the dictionary coded data. The number of consecutive pieces of mismatch information is acquired by using a mismatch information buffer 232*a* and a mismatch information counter 232*b* included in the mismatch information processing unit 232. The operations of the mismatch information buffer 232*a* and the mismatch information counter 232*b* will be described later.

The format conversion unit 23 acquires format conversion data in which the additional information is added to the match information and the mismatch information.

The format conversion data (that is, the dictionary coded data after the format conversion) acquired by converting the format of the dictionary coded data as described above is output (transmitted) to the host 2 via the host interface 4*a*.

The host 2 includes a dictionary decoding unit 2*a*. The dictionary decoding unit 2*a* is a functional unit realized by allowing, for example, the CPU included in the host 2 to execute a predetermined program (that is, software).

The dictionary decoding unit 2*a* performs the dictionary decoding on the format conversion data output from the memory system 3 (format conversion unit 23) as described above to decode the format conversion data to the data (hereinafter, referred to as read data) specified in the read command. The dictionary decoding by the dictionary decoding unit 2*a* is performed by using the additional information added to the match information and the mismatch information in the format conversion data.

Next, an example of the processing procedure of the information processing system 1 according to the first embodiment will be described with reference to the flow-chart of FIG. 4. Here, the processing of the memory system 3 (decompression device 20) when the read command is issued from the host 2 will be mainly described.

The compressed data obtained by performing the dictionary coding and the entropy coding performed on the write data specified in the write command issued from the host 2 is written to the NAND flash memory 5.

Here, it is assumed that the above-described read command is issued from the host 2. In this case, the compressed data (compressed data of the read data) is read from the NAND flash memory 5 based on the read command issued from the host 2 (step S1). In this case, the above-described ECC decoding process may be executed on the compressed data.

Since the compressed data read in step S1 described above is the entropy coded data subjected to the entropy coding, the entropy decoding unit 22 performs the entropy decoding on the compressed data (step S2). The data (that is, dictionary coded data) after the entropy decoding is performed is output from the entropy decoding unit 22 to the format conversion unit 23.

Next, the format conversion unit 23 executes a cutting process on the dictionary coded data output from the entropy decoding unit 22 (step S3). As described above, the dictionary coded data has the data structure in which the match information and the mismatch information are sequentially arranged from the head. In step S3, the match information or the mismatch information arranged at the head of the dictionary coded data are cut out.

When the process of step S3 is executed, the format conversion unit 23 determines whether or not the match information has been cut out in the step S3 based on the identification information attached to the above-described match information and mismatch information (step S4).

When it is determined that the match information has been cut out (YES in step S4), the match information processing unit 231 executes the match information conversion process (step S5). The match information conversion process is a process for adding additional information (length of the match information) related to the match information to the match information cut out in step S3. The details of the match information conversion process will be described later.

On the other hand, when it is determined that the mismatch information has been cut out (NO in step S4), the mismatch information processing unit 232 executes the mismatch information conversion process (step S6). The mismatch information conversion process is a process for adding additional information (the number of consecutive pieces of mismatch information) related to the mismatch information to the mismatch information cut out in step S3. The details of the mismatch information conversion process will be described later.

When the process of step S5 or S6 is executed, the format conversion unit 23 acquires (generates) the format conversion data based on the result of the process of step S5 or S6 (step S7).

The format conversion data acquired in step S8 is output to the host 2 via the host interface 4a as described above (step S8).

When the process of step S8 is executed, it is determined whether the process of steps S1 to S8 described above is executed on all the compressed data of the read data (step S9).

When it is determined that the process has not been executed on all of the compressed data of the read data (NO in step S9), the process returns to step S1 and the process is repeated. In this case, the process is executed on the compressed data of the read data on which the processes of steps S1 to S8 has not been executed.

Figure 4:
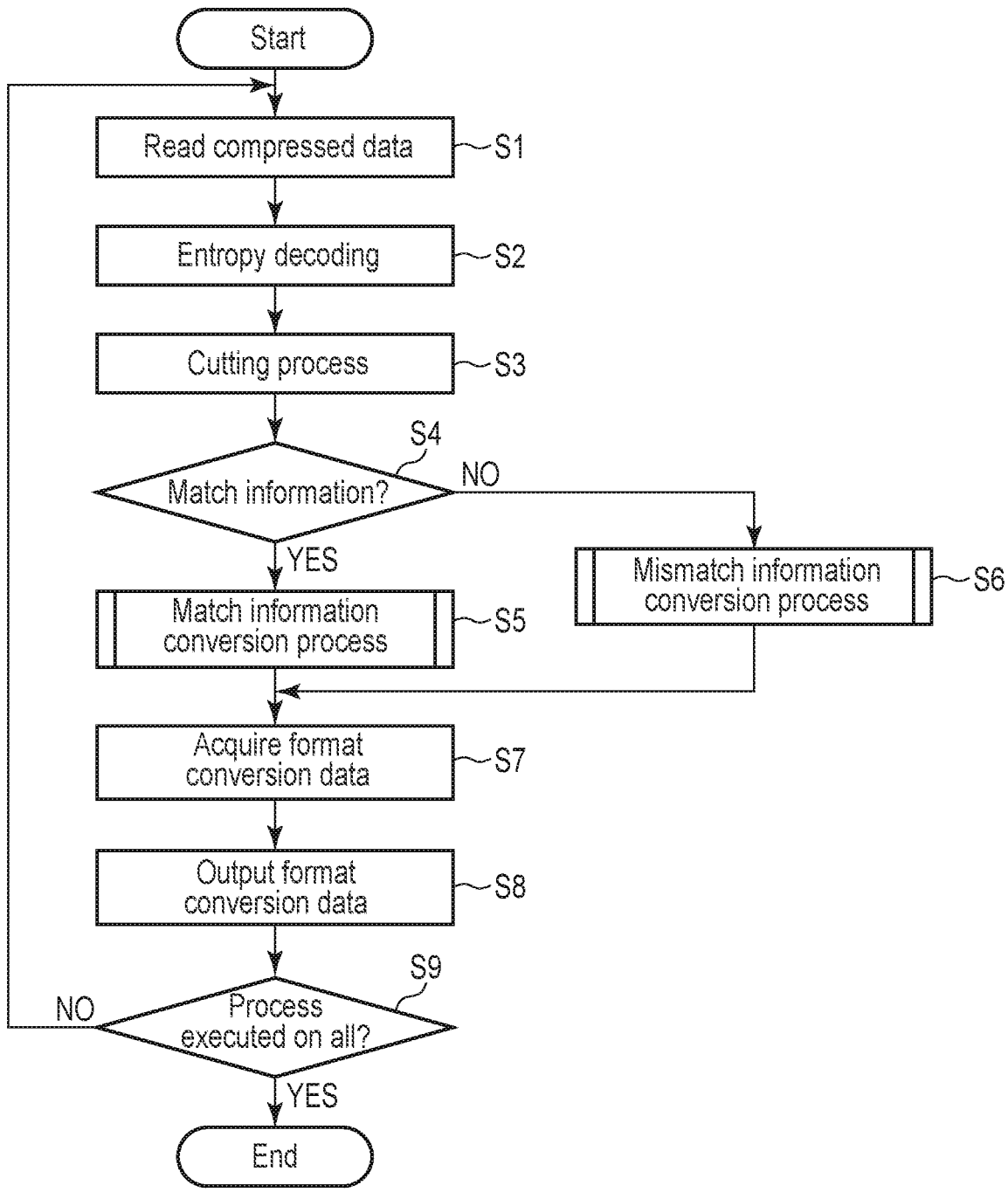
FIG. 4 is a flowchart illustrating an example of a processing procedure of the information processing system according to the first embodiment.

On the other hand, when it is determined that the process has been executed on all the compressed data of the read data (YES in step S9), the process of FIG. 4 ends.

Figure 5:
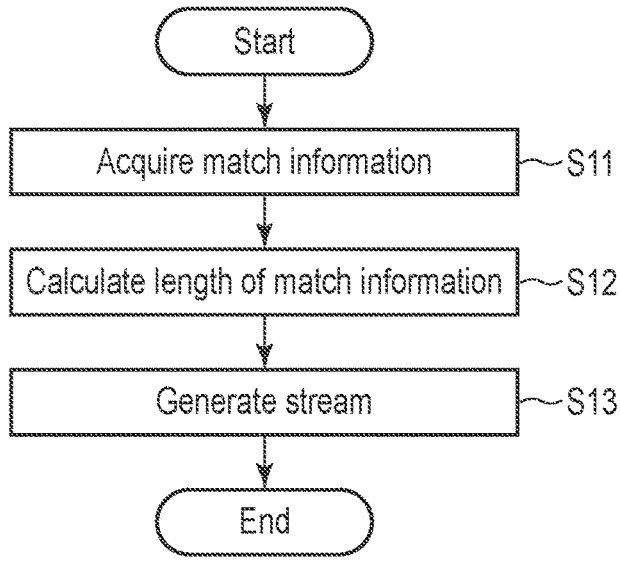
FIG. 5 is a flowchart illustrating an example of a processing procedure of match information conversion processing in the first embodiment.

Next, an example of the processing procedure of the above-described match information conversion process (process of step S5 illustrated in FIG. 4) will be described with reference to the flowchart of FIG. 5.

In the match information conversion process, the match information processing unit 231 acquires the match information cut out in step S3 illustrated in FIG. 4 described above (step S11).

When the process of step S11 is executed, the match information processing unit 231 calculates the length of the match information acquired in step S11 (step S12).

Here, the length of the match information corresponds to a total value of the data lengths of the match position and the match distance included in the match information. Therefore, in step S12, the length of the match information is calculated by adding the data length of the match position and the data length of the match distance.

When the process of step S12 is executed, the match information processing unit 231 adds the length of the match information calculated in step S12 to the match information acquired in step S11 to generate, for example, a stream in which the match information follows the length of the match information (step S13). When the process of step S13 is executed, the match information conversion process ends.

Figure 6:
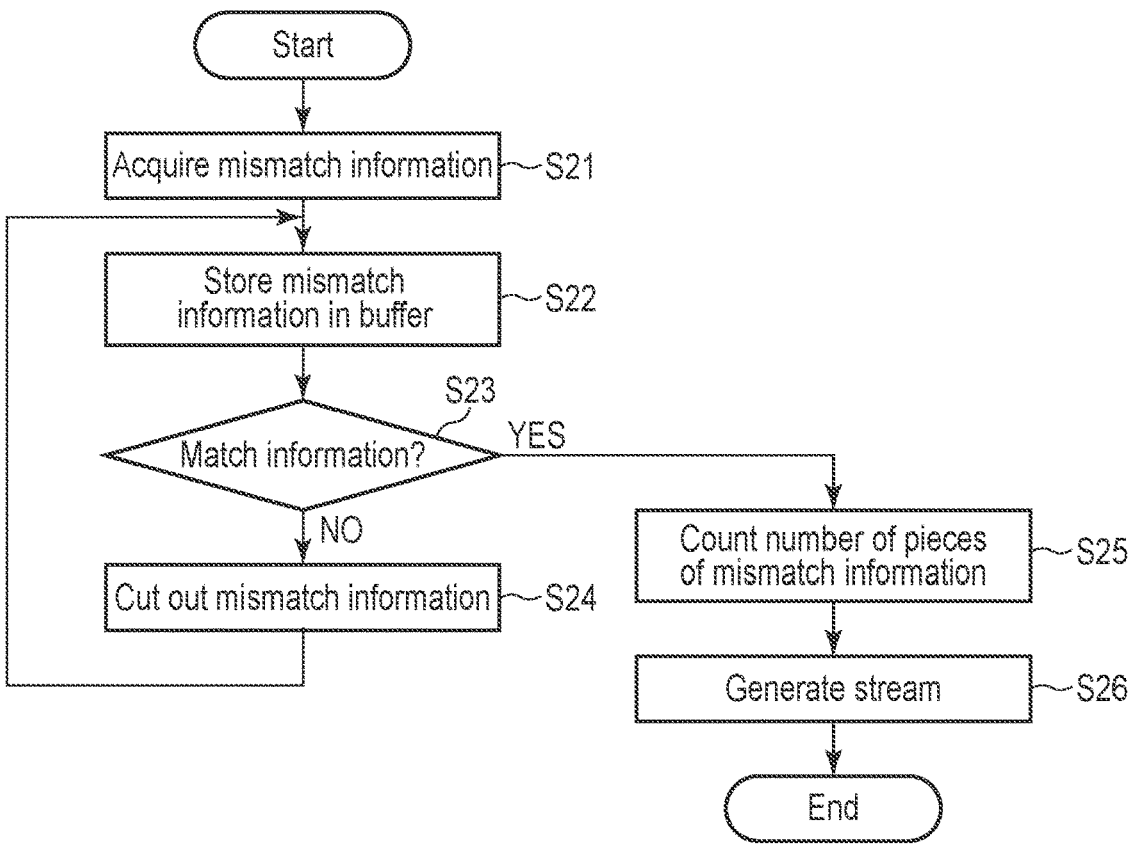
FIG. 6 is a flowchart illustrating an example of a processing procedure of mismatch information conversion processing in the first embodiment.

Next, an example of the processing procedure of the above-described mismatch information conversion process (process of step S6 illustrated in FIG. 4) will be described with reference to the flowchart of FIG. 6.

In the mismatch information conversion process, the mismatch information processing unit 232 acquires the mismatch information cut out in step S3 illustrated in FIG. 4 described above (step S21).

When the process of step S21 is executed, the mismatch information processing unit 232 stores the mismatch information acquired in step S21 in the mismatch information buffer 232a included in the mismatch information processing unit 232 (step S22).

Next, in the dictionary coded data, the mismatch information processing unit 232 determines whether the match information is arranged next to the mismatch information (that is, the mismatch information cut out in step S3 illustrated in FIG. 4) acquired in step S21 described above (step S23).

Here, the case where it is determined that the match information is not arranged next to the mismatch information is assumed (NO in step S23). In this case, in the dictionary coded data, the mismatch information is arranged next to the mismatch information acquired in step S21. Therefore, the mismatch information processing unit 232 cuts out the mismatch information arranged next to the mismatch information acquired in step S21 (step S24).

When the process of step S24 is executed, the process of step S22 is executed. Specifically, the mismatch information cut out in step S24 is stored in the mismatch information buffer 232a.

In this way, in the mismatch information conversion process, the processes of steps S24 and S22 are repeated until it is determined that the match information is arranged next to the mismatch information (that is, the match information appears), so consecutive pieces of mismatch information included in the dictionary coded data can be sequentially stored in the mismatch information buffer 232a.

On the other hand, when it is determined that the match information is arranged next to the mismatch information (YES in step S23), the mismatch information counter 232b included in the mismatch information processing unit 232 counts the number of pieces of mismatch information stored in the mismatch information buffer 232a (step S25).

When the process of step S25 is executed, the mismatch information processing unit 232 reads the consecutive pieces of mismatch information (plurality of pieces of sequentially stored mismatch information) stored in the mismatch information buffer 232a from the mismatch information buffer 232a, and adds the number of consecutive pieces of mismatch information counted in step S25 to the mismatch information. As a result, the mismatch information processing unit 232 generates, for example, a stream in which the number of consecutive pieces of mismatch information is followed by the consecutive pieces of mismatch information (step S26). When the process of step S26 is executed, the mismatch information conversion process ends.

In addition, it is assumed that the consecutive pieces of mismatch information are sequentially stored in the above-described mismatch information buffer 232a, and the consecutive pieces of mismatch information are stored in, for example, the consecutive memory areas of the mismatch information buffer 232a.

In this case, the consecutive pieces of mismatch information stored in the mismatch information buffer 232a are managed by using a write pointer and a read pointer. The write pointer indicates, for example, a position (that is, a position where the mismatch information is written next) in the mismatch information buffer 232a to which the mismatch information is written in step S22. On the other hand, the read pointer indicates a position (that is, a position where reading is started) where the mismatch information that is the head of the consecutive pieces of mismatch information used for generating the stream in step S26 is stored.

Hereinafter, an outline of the above-described dictionary coded data and format conversion data after converting the format of the dictionary coded data will be described with reference to FIG. 7. An upper portion of FIG. 7 illustrates an example of the dictionary coded data, and a lower portion of FIG. 7 illustrates an example of the format conversion data.

Figure 7:
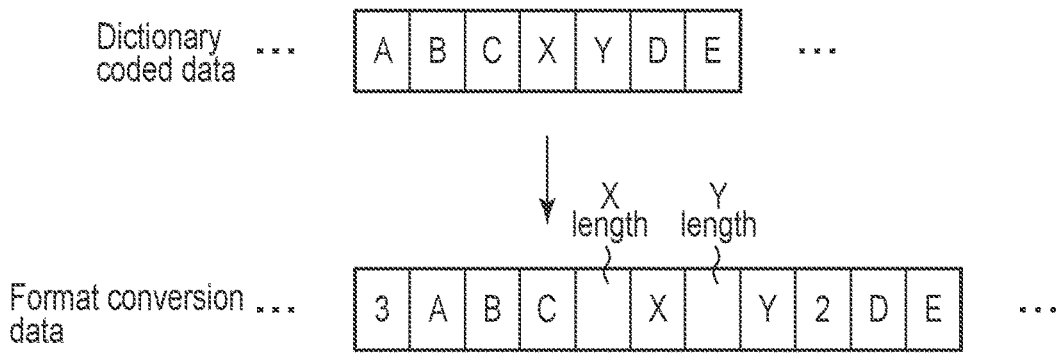
FIG. 7 is a diagram for describing an outline of dictionary coded data and format conversion data in the first embodiment.

In FIG. 7, "A", "B", "C", "D", and "E" represent the mismatch information (mismatch characters) included in the dictionary coded data (format conversion data). On the other hand, in FIG. 7, "X" and "Y" represent match information (match position and match length) included in the dictionary coded data (format conversion data).

In the first embodiment, the dictionary coded data is data compressed based on, for example, a compression algorithm called LZ77, and as illustrated in the upper portion of FIG. 7, has the data structure in which the match information and the mismatch information are consecutively arranged. That is, in the example illustrated in the upper portion of FIG. 7, the dictionary coded data in which mismatch information "A", mismatch information "B", mismatch information "C", match information "X", match information "Y", mismatch information "D", and mismatch information "E" are sequentially arranged from the head.

Here, it is assumed that the process (match information conversion process illustrated in FIG. 5 and mismatch information conversion process illustrated in FIG. 6) illustrated in FIG. 4 is executed on the dictionary coded data illustrated in the upper portion of FIG. 7.

In this case, the mismatch information "A" arranged at the head of the dictionary coded data is cut out from the dictionary coded data, and the mismatch information "A" is stored in the mismatch information buffer 232a.

Further, in the dictionary coded data, since the mismatch information "B" is arranged next to the mismatch information "A", the mismatch information "B" is cut out from the dictionary coded data, and the mismatch information "B" is stored in the mismatch information buffer 232a.

Further, in the dictionary coded data, since the mismatch information "B" is arranged next to the mismatch information "C", the mismatch information "C" is cut out from the dictionary coded data, and the mismatch information "C" is stored in the mismatch information buffer 232a.

Here, in the dictionary coded data, the match information "X" is arranged next to the mismatch information "C". In this case, as described above, "3", which is the number of pieces of mismatch information "A", "B", and "C" stored in the mismatch information buffer 232a, is counted as the number of consecutive pieces of mismatch information.

As a result, a stream "3ABC" is generated in which the number of consecutive pieces of mismatch information "3" is followed by the consecutive pieces of mismatch information "A", "B", and "C".

Next, in the dictionary coded data described above, the match information "X" arranged next to the mismatch information "C" is cut out from the dictionary coded data.

In this case, the length (the data lengths of the match position and the match length included in the match information "X") of the match information "X" cut out from the dictionary coded data is calculated.

Assuming that the length of the match information "X" calculated here is expressed as "X length", a stream "X length X" in which the length "X length" of the match information is followed by the match information "X" is generated.

Further, in the dictionary coded data described above, the match information "Y" arranged next to the match information "X" is cut out from the dictionary coded data.

In this case, the length (the data lengths of the match position and the match length included in the match information "Y") of the match information "Y" cut out from the dictionary coded data is calculated.

Assuming that the length of the match information "Y" calculated here is expressed as "Y length", a stream "Y length Y" in which the length "Y length" of the match information is followed by the match information "Y" is generated.

Next, in the dictionary coded data, since the mismatch information "D" is arranged next to the match information "Y", the mismatch information "D" is cut out from the dictionary coded data, and the mismatch information "D" is stored in the mismatch information buffer 232a.

Further, in the dictionary coded data, since the mismatch information "E" is arranged next to the mismatch information "D", the mismatch information "E" is cut out from the dictionary coded data, and the mismatch information "E" is stored in the mismatch information buffer 232a.

Here, although not illustrated in FIG. 7, in the dictionary coded data, the case where the match information is arranged next to the mismatch information "E", or the mismatch information "E" is the last symbol included in the dictionary coded data (that is, no match information and mismatch information are arranged next to the mismatch information "E") is assumed.

In this case, as described above, "2", which is the number of pieces of mismatch information "D" and "E" stored in the mismatch information buffer 232a, is counted as the number of consecutive pieces of mismatch information.

As a result, a stream "2DE" is generated in which the number of consecutive pieces of mismatch information "2" is followed by the consecutive pieces of mismatch information "D" and "E".

As described above, when the process is executed on all the match information and the mismatch information included in the dictionary coded data shown in the upper portion of FIG. 7, the format conversion data in which the streams "3ABC", "X length X", "Y length Y", and "2DE" are concatenated is acquired (generated).

That is, in the example illustrated in FIG. 7, dictionary coded data "ABCXYDE" can be converted into format conversion data "3ABCX length XY length Y2DE".

In FIG. 7, in the format conversion data, values that directly represent the number such as "3" and "2" are used as the number of consecutive pieces of mismatch information, but the number of consecutive pieces of mismatch information may not be such a direct numerical value. That is, in the format conversion data, information (that is, information on the number of consecutive pieces of mismatch information) that can specify the number of consecutive pieces of mismatch information may be used as the number of consecutive pieces of mismatch information. Similarly, for the length of the match information in the format conversion data, for example, information (information on the length of the match information) that can specify the length of the match information may be used.

Here, the dictionary coded data shown in the upper portion of FIG. 7 has been described as being compressed data based on a compression algorithm called, for example, LZ77, but there are snappy and LZ4 as compression algorithm that can perform dictionary decoding at low load and high speed by, for example, the CPU (that is, software processing), and the dictionary coded data based on the snappy or LZ4 has a data structure in which the mismatch information is arranged after the number of pieces of mismatch information and the match information is arranged after the length of the match information.

Therefore, in the first embodiment, the format conversion unit 23 may be configured to convert the above-described dictionary coded data based on LZ77 into the dictionary coded data (compressed stream) based on the snappy or LZ4.

Here, an example of the data structure (format) of the dictionary coded data based on the snappy will be described with reference to FIGS. 8A and 8B.

The compressed data of the snappy includes two elements, the mismatch information (Literal) and the match information (copy), and the mismatch information and the match information are distinguished by the lower 2 bits of the "tag byte" arranged at the head of each element. The lower 2 bits of the "tag byte" are represented by "00" in the mismatch information, and the lower 2 bits of the "tag byte" are represented by any of "01", "10", and "11" in the match information.

First, the mismatch information will be described with reference to FIG. 8A. In the case of the mismatch information, the upper 6 bits of the "tag byte" represent the length (bit width) of the mismatch information, and the upper 6 bits of the "tag byte" acquire five values "0 to 59", "60", "61", "62", and "63" according to the length of the mismatch information.

Specifically, when the upper 6 bits of the "tag byte" are "0 to 59", the upper 6 bits represent "mismatch information length −1". The length of the mismatch information ranges from 1 to 60, and the "tag byte" is followed by the mismatch information.

In addition, when the upper 6 bits of the "tag byte" are "60", the upper 6 bits indicate that the length of the mismatch information is 61 to 256 bytes, and the value of "mismatch information length −1" is stored in 1 byte after the "tag byte". In this case, the "mismatch information length −1" is expressed in a little endian format, and the value of "mismatch information length −1" is followed by the mismatch information.

In addition, when the upper 6 bits of the "tag byte" are "61", the upper 6 bits indicate that the length of the mismatch information is 257 to 65536 bytes, and the value of "mismatch information length −1" is stored in 2 bytes after the "tag byte". In this case, the "mismatch information length −1" is expressed in a little endian format, and the value of "mismatch information length −1" is followed by the mismatch information.

Figure 8A:
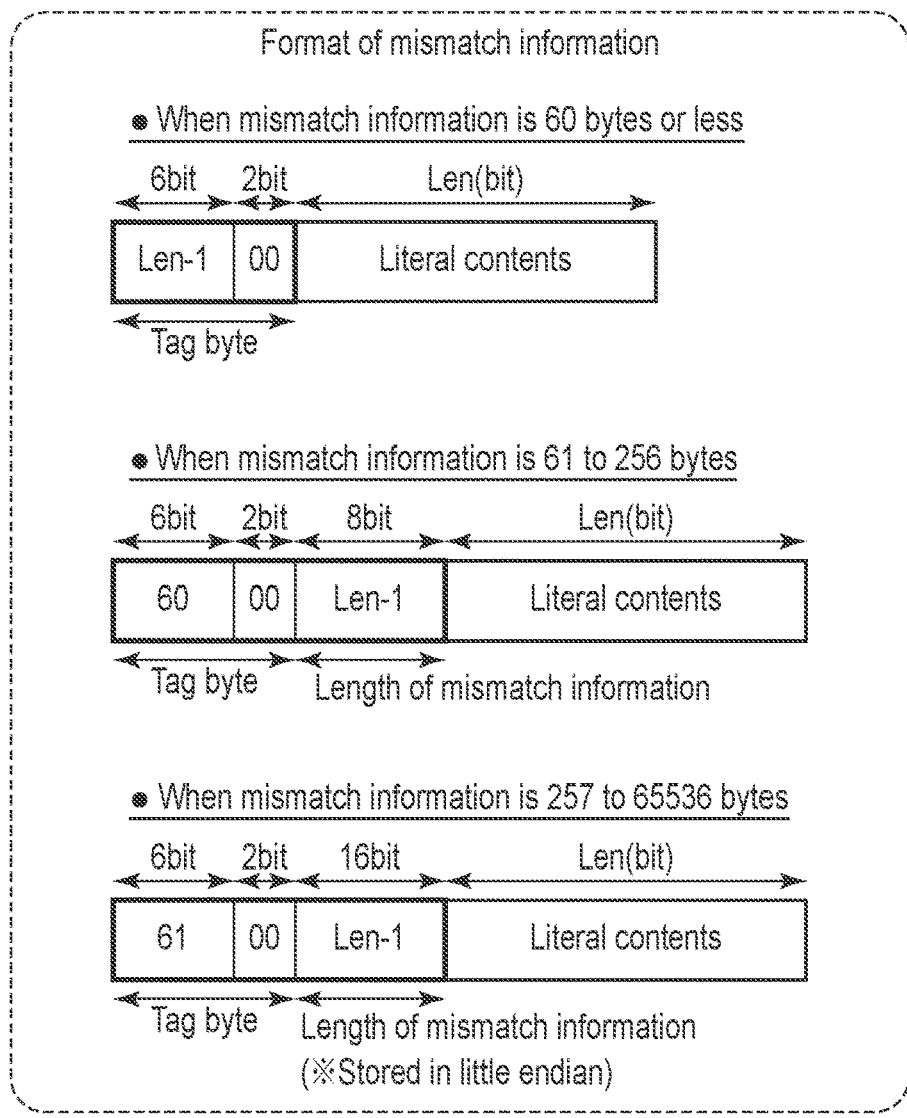
FIG. 8A is a diagram for explaining a data structure of the dictionary coded data based on snappy in the first embodiment.

Although not illustrated in FIG. 8A, when the upper 6 bits of the "tag byte" are "62", a value of "mismatch information length −1" is stored in the 3 bytes after the "tag byte", and when the upper 6 bits of "tag byte" are "63", the value of the "mismatch information length −1" is stored in the 4 bytes after "tag byte". In this case, the "mismatch information length −1" is expressed in a little endian format, and the value of "mismatch information length −1" is followed by the mismatch information.

In this way, according to the compressed data of the snappy, the length of the mismatch information (the number of consecutive pieces of mismatch information) can be obtained by referring to the "tag byte" and the following 0 to 4 bytes.

Next, the match information will be described with reference to FIG. 8B. In the case of the match information, the length of the match information is determined by the lower 2 bits of the "tag byte".

Specifically, when the lower 2 bits of the "tag byte" are "01", 2 bytes including the "tag byte" are the match information. In this case, 3 bits arranged before the lower 2 bits of the "tag byte" represent the "match length −4 (match length=4 to 11)", and upper 3 bits of the "tag byte" and 8 bits after the "tag byte" represent the match position (match distance).

In addition, when the lower 2 bits of the "tag byte" are "10", 3 bytes including the "tag byte" are the match information. In this case, upper 6 bits of the "tag byte" represent "match length −1 (match length=1 to 64)", and 16 bits after the "tag byte" represent the match position (match distance).

Further, when the lower 2 bits of the "tag byte" are "11", 5 bytes including the "tag byte" are the match information. In this case, the upper 6 bits of the "tag byte" represent "match length −1 (match length=1 to 64)", and 32 bits after the "tag byte" represent the match position (match distance).

Figure 8B:
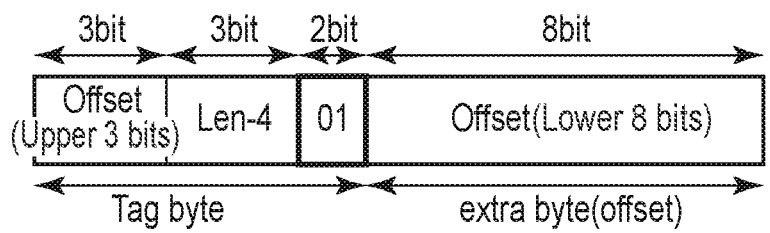
FIG. 8B is a diagram for explaining a data structure of the dictionary coded data based on snappy in the first embodiment.
Figure 8B:
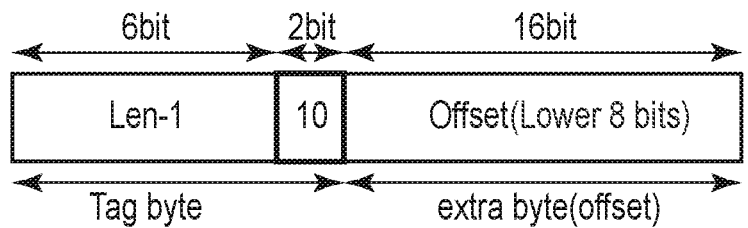
Figure 8B:
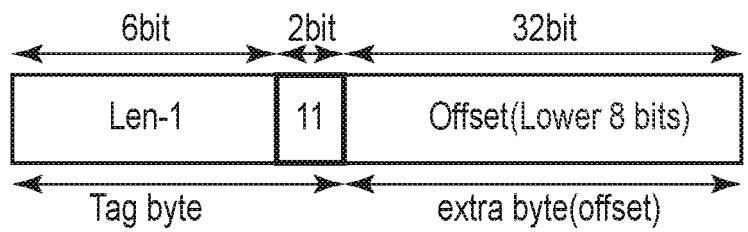

The data structures described in FIGS. 8A and 8B are an example, and in the first embodiment, the (format of) format conversion data output from the memory system 3 (format conversion unit 23) to the host 2 may be different from one illustrated in FIGS. 8A and 8B.

Here, as described above, the format conversion data output from the memory system 3 is decoded by the dictionary decoding unit 2a (CPU provided in the host 2) included in the host 2. The format conversion data includes the match information (match position and match length) following the length of the match information and the consecutive pieces of mismatch information following the number of consecutive pieces of mismatch information.

In this case, in the dictionary decoding of the format conversion data, the dictionary decoding unit 2a can cut out the match information (match position and match length) and the mismatch information (raw data), respectively, at high speed from the format conversion data, based on the length of the match information and the number of consecutive pieces of mismatch information included in the format conversion data.

Specifically, the dictionary decoding unit 2a has a history buffer, and the data decoded from the match information (match position and match length) cut out from the format conversion data in the past and the raw data (mismatch information) cut out from the format conversion data in the past are sequentially stored in the history buffer.

When the match information is cut out from the format conversion data, the dictionary decoding unit 2a reads the buffer data from the history buffer based on the match position (address) and the match length included in the match information. In this case, the dictionary decoding unit 2a reads the buffer data of the match length (the number of characters) included in the match information, which is the buffer data stored in the match position included in the match information. The buffer data read in this way corresponds to the data decoded from the match information (match position and match length).

On the other hand, when the mismatch information is cut out from the format conversion data, the mismatch information is raw data (that is, uncoded data), so the raw data can be used as it is in the decompressed data.

That is, the dictionary decoding unit 2a can acquire the decompressed data (text) that includes data decoded based on the match position and the match length included in the match information cut out from the format conversion data as described above and raw data which is the mismatch information.

As described above, in the first embodiment, the dictionary coded data (second data) obtained by compressing write data (first data) specified in the host 2 by the dictionary coding (first compression method) is output, entropy coded data (third data) obtained by compressing the dictionary coded data by the entropy coding (second compression method) is output, and data (fourth data) based on the entropy coded data is written to the NAND flash memory 5 (non-volatile memory).

In addition, in the first embodiment, when the read command is issued from the host 2, the entropy coded data written to the NAND flash memory 5 is decoded to the dictionary coded data, format conversion data (fifth data) obtained by converting the format of the dictionary coded data is acquired, and the format conversion data is output to the host 2.

In this way, the format conversion data output from the memory system 3 is decoded to the read data (first data) by the dictionary decoding unit 2a included in the host 2.

In the first embodiment, compared with the configuration in which the decompressed data (uncompressed data) obtained by performing all the decompressed process (entropy decoding and dictionary decoding) on the compressed data on the memory system 3 (decompression device 20) side is output to the host 2, with the above-described configuration, the format conversion data (dictionary coded data), which has a smaller amount of data than the decompressed data, is output to the host 2, so it is possible to reduce the system bus bandwidth usage rate located between the host 2 and the memory system 3.

In addition, in the first embodiment, the format conversion data obtained by converting the dictionary coded data format is output to the host 2 so that the CPU included in the host 2 can perform dictionary decoding at low load and high speed. Specifically, the dictionary coded data includes the match information and the mismatch information, but as the additional information regarding the match information and the mismatch information, the format conversion data to which the information on the length of the match information and the information on the number of consecutive pieces of mismatch information are added is output to the host 2. The first embodiment describes that both the information on the length of the match information and the information on the number of consecutive pieces of mismatch information are added, but may have the configuration in which only any one of the information on the length of the match information and the information on the number of consecutive pieces of mismatch information is added.

According to such a configuration, in the dictionary decoding performed on the host 2 side, the match information and the mismatch information are easily cut out from the format conversion data based on the length of the match information and the number of consecutive pieces of mismatch information, so it is possible to suppress the processing load of the CPU included in the host 2 (that is, it is possible to reduce the time required for the dictionary decoding performed on the host 2 side).

Therefore, in the first embodiment, even when the memory system 3 is used for the information processing system 1 having a high frequency of read command such as a database, since it is possible to reduce the bus use bandwidth while suppressing the load on the host 2 (CPU), the performance of the information processing system 1 as a whole can be improved.

The first embodiment describes that the additional information added to the match information and the mismatch information is the length of the match information and the number of consecutive pieces of mismatch information, but may have the configuration in which when the processing load on the host 2 side described above can be reduced, the additional information other than that described in the first embodiment is added.

Furthermore, the first embodiment mainly describes that the configuration in which data is compressed (coded) by the compression method in which the dictionary coding and the entropy coding are combined, but the type of coding adopted as the compression method for compressing the data may be a type other than the dictionary coding and the entropy coding, and the first embodiment is applicable to any configuration of outputting the compressed data (data compressed by at least one coding method) whose format has been converted so as to reduce the processing load of the host 2 (CPU) as described above to the host 2.

Second Embodiment

Next, a second embodiment will be described. In the second embodiment, a detailed description of the same parts as those of the first embodiment above described will be omitted, and parts different from the first embodiment will be mainly described. Further, a hardware configuration of an information processing system according to a second embodiment is the same as that in the first embodiment described above, and therefore, will be described with reference to FIG. 1 as appropriate.

Figure 9:
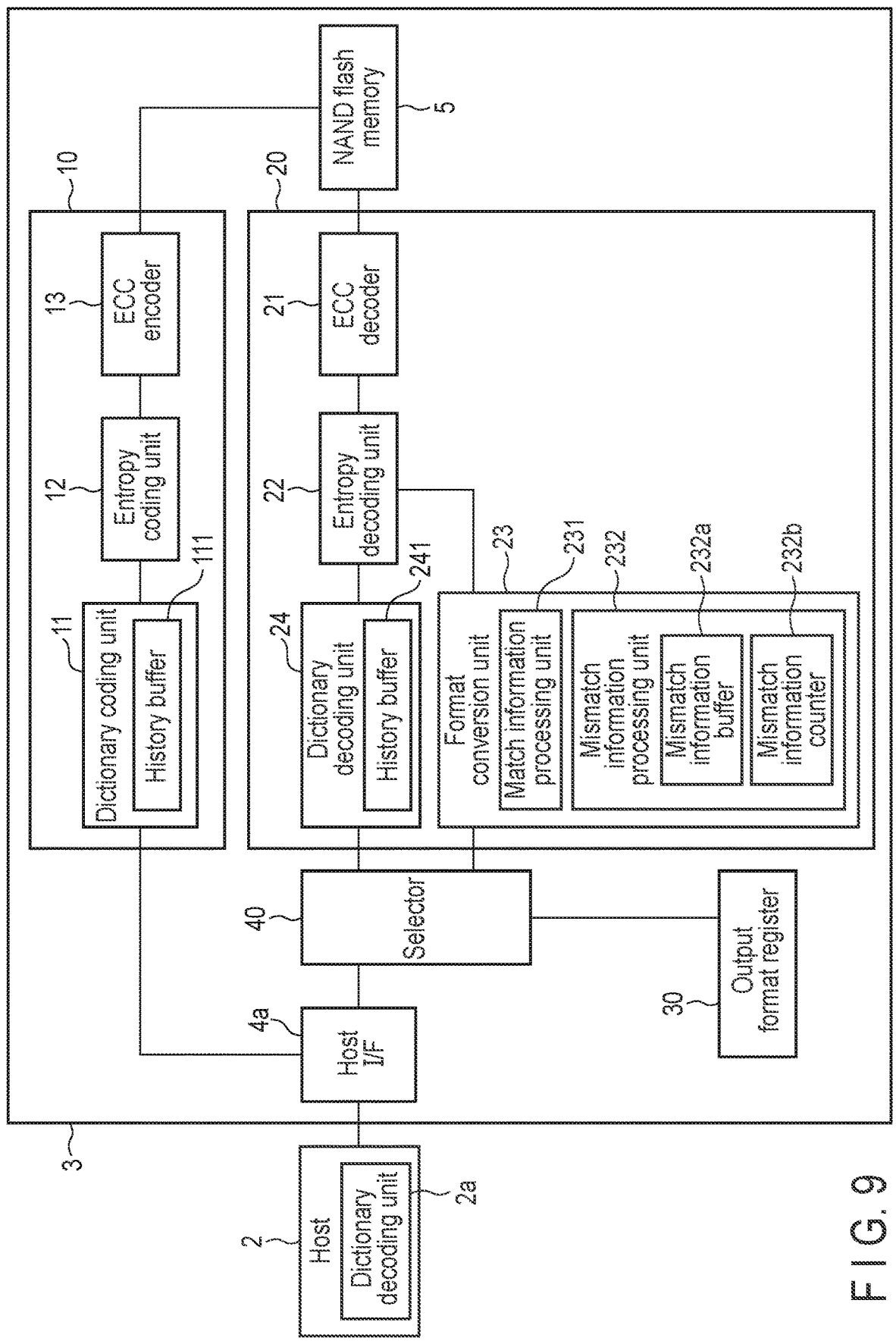
FIG. 9 is a block diagram illustrating an example of a functional configuration of the information processing system according to a second embodiment.

FIG. 9 is a block diagram illustrating an example of a functional configuration of the information processing system 1 according to the second embodiment.

As illustrated in FIG. 9, a decompression device 20 in the second embodiment further includes a dictionary decoding unit 24 in addition to the ECC decoder 21, the entropy decoding unit 22, and the format conversion unit 23 described in the first embodiment described above. In the second embodiment, the dictionary coded data decoded by the entropy decoding unit 22 when the read command is issued from the host 2 is output to a format conversion unit 23 and a dictionary decoding unit 24.

The dictionary decoding unit 24 has, for example, a history buffer 241, and uses the history buffer 241 to decode the dictionary coded data output from the entropy decoding unit 22 (that is, performs dictionary decoding on the dictionary coded data).

The first embodiment described above describes that the dictionary decoding unit 2a included in the host 2 cuts out the match information and the mismatch information from the format conversion data based on the length of the match information and the number of consecutive pieces of mismatch information and performs the dictionary decoding, but in the second embodiment, the length of the match information and the number of consecutive pieces of mismatch information are not added to the dictionary coded data output from the entropy decoding unit 22 to the dictionary decoding unit 24. Therefore, the dictionary decoding unit 24 performs the dictionary coding while sequentially cutting out the match information and the mismatch information included in the dictionary coded data from the head of the dictionary coded data.

The result (that is, decompressed data) of the dictionary decoding by the dictionary decoding unit 24 is output from the dictionary decoding unit 24 as the data (read data) specified in the read command issued from the host 2.

Here, in the second embodiment, when the read command is issued from the host 2, the decompressed data is output from the dictionary decoding unit 24 described above, and the format conversion data is output from the format conversion unit 23.

Therefore, the memory system 3 according to the second embodiment further includes an output format register 30 and a selector 40 as a configuration for selectively outputting such decompressed data and format conversion data to the host 2.

The output format register 30 stores (sets) information (hereinafter referred to as output format information) that indicates the output format of data from the memory system 3 to the host 2.

The selector 40 selects one of the decompressed data and the format conversion data based on the output format information stored in the output format register 30. In this case, the selector 40 may select either the decompressed data or the format conversion data by switching a physical connection between the dictionary decoding unit 24 and the format conversion unit 23, for example.

Next, an example of the processing procedure of the information processing system 1 according to the second embodiment will be described with reference to the flowchart of FIG. 10. Here, the processing of the memory system 3 when the read command is issued from the host 2 will be mainly described.

First, processes of steps S31 and S32 corresponding to processes of steps S1 and S2 illustrated in FIG. 4 described above are executed. The dictionary coded data after the entropy decoding is performed in step S32 is output to the dictionary decoding unit 24 and the format conversion unit 23.

When the process of step S32 is executed, the dictionary decoding unit 24 performs dictionary decoding on the dictionary coded data output from the entropy decoding unit 22 (step S33). As a result, the dictionary decoding unit 24 acquires the decompressed data in which the dictionary coded data is decompressed (decoded).

Similarly, when the process of step S32 is executed, the format conversion unit 23 performs the format conversion on the dictionary coded data output from the entropy decoding unit 22 (step S34). Since the format conversion performed in step S34 is a process corresponding to the processes of steps S3 to S7 illustrated in FIG. 4 described above, detailed description thereof will be omitted here.

The processing of step S33 and the processing of step S34 described above are executed in parallel, and when the process of step S33 is executed, the decompressed data is output from the dictionary decoding unit 24 and when the process of step S34 is executed, the format conversion data from the format conversion unit 23 is output.

Here, in the second embodiment, the output format information is stored in the output format register 30. The output format information includes, for example, first output format information instructing to output in the format of the decompressed data (raw data) and second output format information instructing to output in the format of the format conversion data.

In this case, the selector 40 determines whether or not the first output format information is stored in the output format register 30 (step S35).

When it is determined that the first output format information is stored in the output format register 30 (YES in step S35), the selector 40 selects the decompressed data of the decompressed data output from the dictionary decoding unit 24 and the format conversion data output from the format conversion unit 23 and outputs the selected decompressed data to the host 2 (step S36). In this case, it is not necessary to perform the dictionary decoding on the host 2 side.

On the other hand, when it is determined that the first output format information is not stored in the output format register 30 (that is, the second output format information is stored) (NO in step S35), the selector 40 selects the format conversion data of the decompressed data output from the dictionary decoding unit 24 and the format conversion data output from the format conversion unit 23 and outputs the selected format conversion data to the host 2 (step S37). In this case, on the host 2 side, the dictionary decoding unit 2a performs the dictionary decoding of the format conversion data.

When the process of step S36 or S37 is executed, a process of step S38 corresponding to the process of step S9 illustrated in FIG. 4 as described above are executed. When it is determined that the process has not been executed on all the compressed data of the read data in step S38, the process returns to step S31 and is repeated. On the other hand, when it is determined that the process has been executed on all the compressed data of the read data, the process of FIG. 10 ends.

As described above, in the second embodiment, one of the decompressed data and the format conversion data is output to the host 2 based on the output format information (first output format information or second output format information) stored in the output format register 30.

According to such a configuration, for example, when the decompressed data is output to the host 2 by storing the first output format information in the output format register 30, since it is not necessary to perform the dictionary decoding on the host 2 side, the load on host 2 (CPU) can be suppressed. On the other hand, for example, when the format conversion data is output to the host 2 by storing the second output format information in the output format register 30, the system bus bandwidth usage rate can be reduced as described in the first embodiment described above.

The output format information (first output format information or second output format information) stored in the output format register 30 is specified by the host 2 (CPU) based on, for example, the operating state or the like of the information processing system 1. Further, the output format information may be specified, for example, at the time of starting (booting) the information processing system 1, or may be specified for each read command issued from the host 2.

In the configuration in which the output format information is specified when the information processing system 1 is started, one output format information may be stored in the output format register 30, and it is possible to perform an operation for all the read commands issued from the host 2 while the information processing system 1 operates so that data (decompressed data or format conversion data) in the same format corresponding to the output format information is output from the memory system 3.

On the other hand, in the configuration in which the output format information is specified for each read command, the output format information for each read command is stored in the output format register 30, and it is possible to perform an operation in which data (decompressed data or format conversion data) in a different format corresponding to the output format information is output from the memory system 3 for each read command.

In the case of the configuration in which the output format information is specified for each read command as described above, for example, an NVMe standard interface may be used as a host interface 4a between the host 2 (CPU) and the memory system 3.

Further, the second embodiment describes that the selector 40 selects one of the decompressed data output from the dictionary decoding unit 24 and the format conversion data output from the format conversion unit 23, but may have the configuration in which the selector 40 selectively operates (controls) only one of the dictionary decoding unit 24 and the format conversion unit 23 based on the output format information stored in the output format register 30.

Specifically, when the first output format information is stored in the output format register 30, the selector 40 may operate the dictionary decoding unit 24 of the dictionary decoding unit 24 and the format conversion unit 23 to output the decompressed data output from the dictionary decoding unit 24 to the host 2. On the other hand, when the second output format information is stored in the output format register 30, the selector 40 may operate the format conversion unit 23 of the dictionary decoding unit 24 and the format conversion unit 23 to output the format conversion data output from the format conversion unit 23 to the host 2.

Third Embodiment

Next, a third embodiment will be described. In a third embodiment, detailed description of the same parts as those of the first and second embodiments described above will be omitted, and parts different from the first and second embodiments will be mainly described. Further, a hardware configuration of an information processing system according to a second embodiment is the same as that in the first embodiment described above, and therefore, will be described with reference to FIG. 1 as appropriate.

FIG. 11 is a block diagram illustrating an example of a functional configuration of an information processing system 1 according to the third embodiment.

In the decompression device 20 in the first and second embodiments described above, the mismatch information processing unit 232 of the format conversion unit 23 has been described as including the mismatch information buffer 232a, but in a decompression device 20 in the third embodiment, the mismatch information processing unit 232 includes a buffer control unit 232c instead of the mismatch information buffer 232a.

The third embodiment is different from the above-described second embodiment in that the history buffer 241 included in the dictionary decoding unit 24 described in the second embodiment described above is shared by the format conversion unit 23 (mismatch information processing unit 232) and the dictionary decoding unit 24.

That is, the buffer control unit 232c controls the history buffer 241 so that the history buffer 241 is used (that is, the mismatch information is stored in the history buffer 241 and the mismatch information is read from the history buffer 241) as in the case of the mismatch information buffer 232a described in the above-described first embodiment when the additional information (the number of consecutive pieces of mismatch information) is added to the mismatch information.

Figure 10:
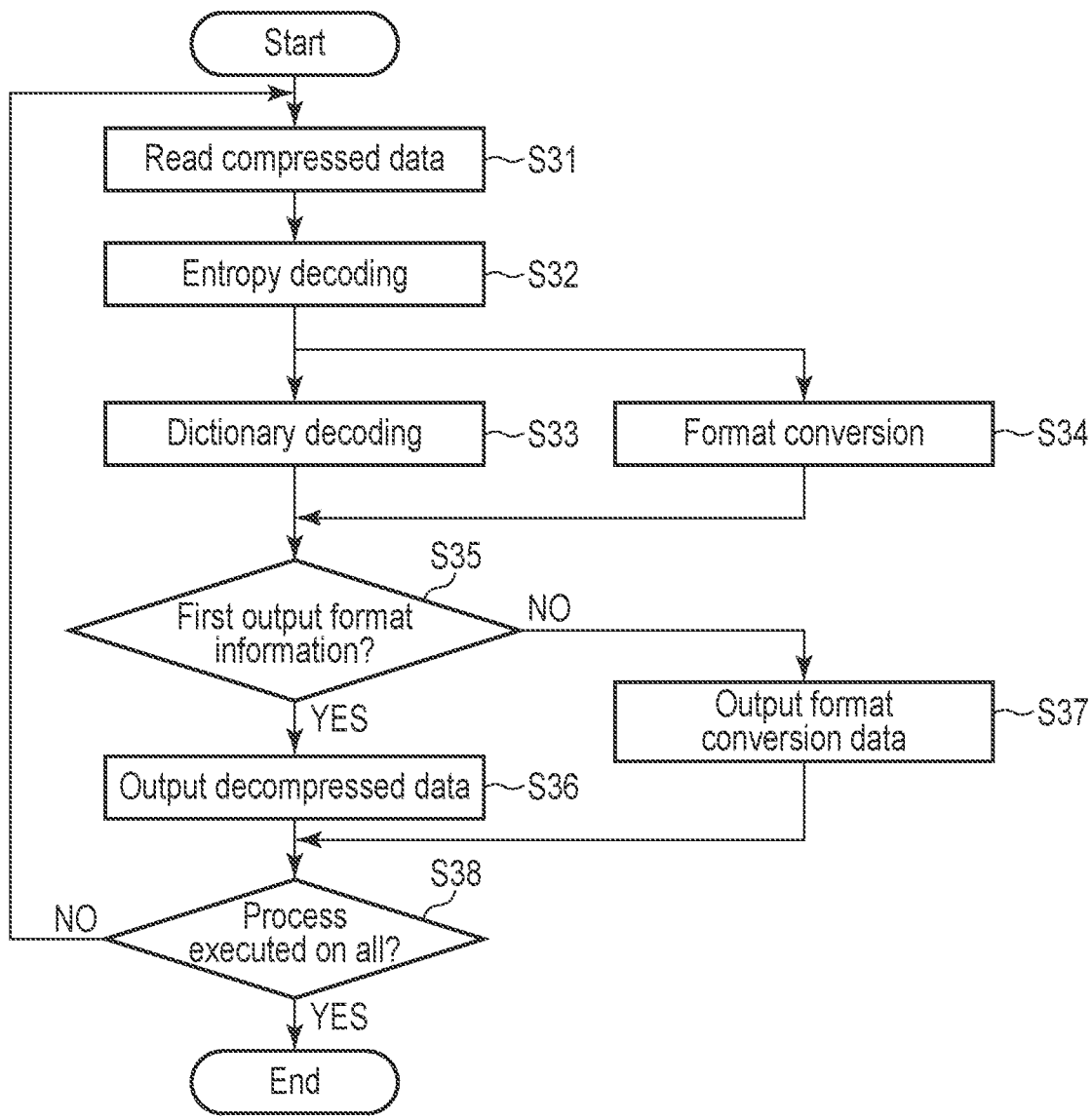
FIG. 10 is a flowchart illustrating an example of a processing procedure of the information processing system according to the second embodiment.

Here, the second embodiment described above describes that the process of step S33 (dictionary decoding by the dictionary decoding unit 24) and the process of step S34 (format conversion by the format conversion unit 23) illustrated in FIG. 10 are executed in parallel, but since the third embodiment has the configuration in which the history buffer 241 included in the dictionary decoding unit 24 is shared by the dictionary decoding unit 24 and the format conversion unit 23 as described above, the dictionary decoding unit 24 and the format conversion unit 23 cannot operate at the same time (that is, the history buffer 241 is used at the same time).

Therefore, in the third embodiment, when the first output format information is stored output format register 30, the selector 40 operates only the dictionary decoding unit 24 based on the first output format information. In this case, the dictionary decoding unit 24 can perform the dictionary decoding on the dictionary coded data using the history buffer 241.

On the other hand, it is assumed that when the second output format information is stored in the output format register 30, the selector 40 operates only the format conversion unit 23 based on the second output format information. In this case, the format conversion unit 23 can convert the format of the dictionary coded data using the history buffer 241 included in the dictionary decoding unit 24 and acquire the format conversion data.

When the format conversion unit 23 uses the history buffer 241, the history buffer 241 stores the mismatch information, and the mismatch information may be managed by using a write pointer and a read pointer described in the first embodiment described above.

As described above, even when the third embodiment may have the configuration in which the format conversion unit 23 acquires the format conversion data using the history buffer 241 included in the dictionary decoding unit 24 (that is, the mismatch information included in the dictionary coded data is stored in the history buffer 241 to count the number of consecutive pieces of mismatch information), it is possible to realize the effects described in the second embodiment described above.

Further, in the third embodiment, since the format conversion unit 23 (mismatch information processing unit 232) does not need to have the mismatch information buffer 232a, it is possible to reduce the memory area for realizing the mismatch information buffer 232a.

The third embodiment describes that the history buffer 241 included in the dictionary decoding unit 24 is used by the mismatch information processing unit 232 included in the format conversion unit 23, but it is assumed that the memory system 3 (compression device 10 and decompression device 20) operates within the range in which the mismatch information (a plurality of consecutive pieces of mismatch information) stored in the history buffer 241 does not overflow from the history buffer 241 (that is, compression unit in the dictionary coding≤range of a size of the history buffer 241).

Fourth Embodiment

Next, a fourth embodiment will be described. In the fourth embodiment, a detailed description of the same parts as those of the first to third embodiments above described will be omitted, and parts different from the first to third embodiments will be mainly described. Further, a hardware configuration of an information processing system according to a second embodiment is the same as that in the first embodiment described above, and therefore, will be described with reference to FIG. 1 as appropriate.

FIG. 12 is a block diagram illustrating an example of a functional configuration of an information processing system 1 according to the fourth embodiment.

The fourth embodiment is different from the second embodiment described above in that the host 2 includes a monitoring unit 2b and a determination unit 2c. In the fourth embodiment, the monitoring unit 2b, and the determination unit 2c may be executed by the CPU included in the host 2 executing a predetermined program (that is, software), by hardware, or a combination of software and hardware.

The monitoring unit 2b monitors an operating state of the information processing system, and outputs information (hereinafter referred to as operating state information) indicating the operating state to the determination unit 2c.

The determination unit 2c determines the output format information stored in the output format register 30 based on the operation status indicated by the operation state information output by the monitoring unit 2b.

In this way, the output format information determined by the determination unit 2c is output from the host 2 to the memory system 3 and stored in the output format register 30.

Next, an example of a processing procedure of the information processing system 1 according to the present embodiment will be described with reference to the flowchart of FIG. 13. Here, the process of the host 2 will be mainly described. The process illustrated in FIG. 13 may be executed at a predetermined timing, or may be executed based on, for example, an instruction by an administrator or the like.

First, the monitoring unit 2b monitors the operating state (performance) of the information processing system 1. In the fourth embodiment, the operating state of the information processing system 1 monitored by the monitoring unit 2b includes, for example, the bandwidth usage rate (hereinafter, simply referred to as the bus bandwidth usage rate) of the system bus arranged between the host 2 and the memory system 3, the usage rate of the CPU (hereinafter, simply referred to as the CPU usage rate) included in the host 2, and the like. In this case, the monitoring unit 2b acquires the bus bandwidth usage rate and the CPU usage rate as the operating state information indicating the operating state of the information processing system 1 (step S41).

Next, the determination unit 2c determines whether or not the bus bandwidth usage rate acquired as the operating state information in step S41 is equal to or higher than a predetermined value (hereinafter referred to as the first threshold value) (step S42).

When it is determined that the bus bandwidth usage rate is not equal to or greater than a first threshold value (that is, the bus bandwidth usage rate is less than the first threshold value) (NO in step S42), the determination unit 2c determines whether the CPU usage rate acquired as the operating state in step S41 is equal to or greater than a predetermined value (hereinafter, referred to as a second threshold value) or greater (step S43).

When it is determined that the CPU usage rate is equal to or greater than the second threshold value (YES in step S43), the determination unit 2c determines the first output format information as the output format information stored in the output format register 30 (step S44).

Figure 13:
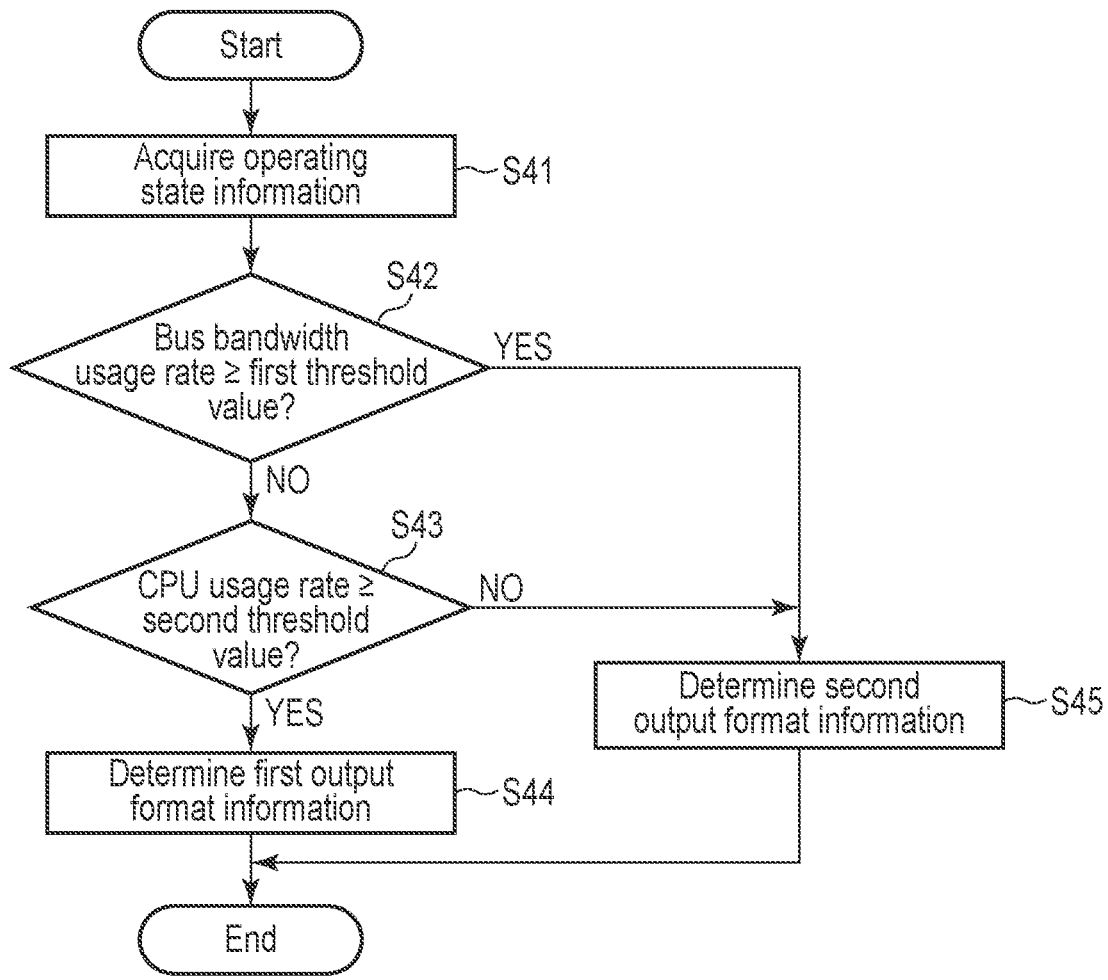
FIG. 13 is a flowchart illustrating an example of a processing procedure of the information processing system according to the fourth embodiment.

That is, according to the process illustrated in FIG. 13, when the bus bandwidth usage rate is less than the first threshold value and the CPU usage rate is equal to or greater than the second threshold value, the first output format information that instructs to output in the format of the decompressed data is determined.

On the other hand, when it is determined that the bus bandwidth usage rate is equal to or greater than the first threshold value (YES in step S42), the determination unit 2c determines the second output format information as the output format information stored in the output format register 30 (step S45).

That is, according to the process illustrated in FIG. 13, when the bus bandwidth usage rate is equal to or greater than the first threshold value, the second output format information that instructs to output in the format of the format conversion data is determined.

In FIG. 13, when it is determined that the CPU usage rate is not equal to or greater than the second threshold value (the CPU usage rate is less than the second threshold value) (NO in step S43), the process of step S45 is illustrated to be executed. However, in this case (that is, when the bus bandwidth usage rate is less than the first threshold and the CPU usage rate is less than the second threshold value), the first output format information may be determined.

When the process of step S44 described above is executed, the first output format information determined in step S44 is stored in the output format register 30 included in the memory system 3. On the other hand, when the process of step S45 described above is executed, the second output format information determined in step S45 is stored in the output format register 30 included in the memory system 3.

When the read command is issued from the host 2 after the process of FIG. 13 is executed, for example, the process illustrated in FIG. 10 described above may be executed.

The process illustrated in FIG. 13 may be executed for each read command issued from the host 2. In this case, it is assumed that the output format information determined for each read command is stored in the output format register 30. In the case of the configuration in which the output format information is determined for each read command as described above, as described in the second embodiment described above, for example, an NVMe standard interface may be used as the host interface 4a between the host 2 (CPU) and the memory system 3.

As described above, the fourth embodiment monitors the operating state of the information processing system 1 and determines the output format information (first output format information or second output format information) based on the operating state. According to such a configuration, since the output format information stored in the output format register 30 can be dynamically changed according to the operating state (bus bandwidth usage rate and CPU usage rate) of the information processing system 1, it is possible to efficiently improve the performance of the entire information processing system 1.

The fourth embodiment describes that when the read command is issued from the host 2 after the process of FIG. 13 is executed, the process illustrated in FIG. 10 is executed (that is, the fourth embodiment is applied to the second embodiment), but the fourth embodiment may be applied to the third embodiment (that is, the confirmation in which the history buffer 241 included in the dictionary decoding unit 24 is shared by the dictionary decoding unit 24 and the format conversion unit 23).

Fifth Embodiment

Next, a fifth embodiment will be described. In a fifth embodiment, a detailed description of the same parts as those of the first to fourth embodiments above described will be omitted, and parts different from the first to fourth embodiments will be mainly described. Further, a hardware configuration of an information processing system according to a second embodiment is the same as that in the first embodiment described above, and therefore, will be described with reference to FIG. 1 as appropriate.

Here, the fifth embodiment assumes that the above-described NVMe standard interface is adopted as a host interface 4a between a host 2 and a memory system 3, and the fifth embodiment corresponds to a specific example of handling a read command between the host 2 and the memory system 3 via the NVMe standard interface.

FIG. 14 is a block diagram illustrating an example of a functional configuration of an information processing system 1 according to the fifth embodiment.

In the fifth embodiment, the host 2 includes a submission queue (SQ) 2d and a completion queue (CQ) 2e for handling various commands including a read command between the host 2 and the memory system 3.

The submission queue 2d is a queue in which, for example, the read command issued from the host 2 is stored (submitted).

The completion queue 2e is a queue that stores a response (a completion response indicating that the execution of the command is completed) to, for example, the read command issued from the host 2.

In the fifth embodiment, for example, it is assumed that a memory area for realizing the submission queue 2d and the completion queue 2e is allocated in the memory or the like included in the host 2. Further, in the following description, it is assumed that the read command is stored in the submission queue 2d, but the submission queue 2d stores the address and the like of the memory (DRAM) in which the read command is stored and the read command may be stored in a memory area different from the submission queue 2d.

Further, although a detailed description will be described later, in the fifth embodiment, the output format information is determined for each read command by the determination unit 2c, and the output format information determined for the read command stored in the submission queue 2d is stored in the output format register 30 by the host interface 4a that extracts the read command from the submission queue 2d.

Hereinafter, the operation of the information processing system 1 (host 2 and memory system 3) using the submission queue 2d and the completion queue 2e described above will be described with reference to FIG. 15. It is assumed that in the fifth embodiment, the submission queue 2d and the completion queue 2e are realized as, for example, a FIFO type ring buffer.

Here, when for example, a read command 301 is issued from the host 2, the host 2 (CPU) stores the read command 301 in the submission queue 2d (step S51). In this case, the host 2 adds the read command 301 to an end (that is, tail) of other commands already stored in the submission queue 2d.

Assuming that the output format information is determined for each read command 301 issued from the host 2 as described above, the process illustrated in FIG. 13 described above is executed before the read command 301 is stored in the submission queue 2d. In this case, the output format information determined for the read command 301 issued from the host 2 is added to the read command 301 stored in the submission queue 2d.

When the read command is stored in the submission queue 2d as described above, the memory system 3 is notified that the read command 301 is stored in the submission queue 2d. As a result, the host interface 4a can extract the read command 301 stored in the submission queue 2d from the submission queue 2d (step S52). In this case, the host interface 4a extracts the read command at the beginning (that is, head) of the plurality of read commands 301 stored in the submission queue 2d.

Here, the output format information is attached to the read command 301 extracted from the submission queue 2d as described above, and the host interface 4a stores the output format information in the output format register 30. When the output format information is stored in the output format register 30 in this way, the memory system 3 executes the process illustrated in FIG. 10 described above.

When the decompressed data or the format conversion data is output from the memory system 3, the host interface 4a stores a completion notification 302 indicating that the execution of the read command 301 extracted from the submission queue 2d described above is completed in the completion queue 2e (step S53). In this case, the host interface 4a adds the completion notification 302 to a tail of another completion notification 302 already stored in the completion queue 2e.

The completion notification 302 stored in the completion queue 2e is extracted by the host 2 (step S54). In this case, the host 2 extracts the completion notification 302 at the head of the plurality of completion notifications 302 stored in the completion queue 2e.

Here, the data (decompressed data or format conversion data) output from the memory system 3 in response to the read command 301 extracted from the submission queue 2d is stored in, for example, the memory (that is, separate memory area from the completion queue 2e) included in the host 2. In this case, the completion notification 302 indicating that the execution of the read command 301 stored in the completion queue 2e is completed includes an address (pointer) in the memory in which the data output from the memory system 3 based on, for example, the read command 301 is stored and the output format information (that is, information on the data) attached to the read command.

When such a completion notification 302 is extracted from the completion queue 2e by the host 2, the host 2 can acquire the data output from the memory system 3 based on the address included in the completion notification 302.

When the output format information included in the completion notification 302 is the first output format information (that is, the completion notification 302 indicating that the execution of the read command 301 for which the first output format information has been determined has been completed is extracted from the completion queue 2e), since the decompressed data is acquired, the host 2 does not perform the dictionary decoding. On the other hand, when the output format information included in the completion notification 302 is the second output format information (that is, the completion notification 302 indicating that the execution of the read command 301 for which the second output format information has been determined has been completed is extracted from the completion queue 2e), since the format conversion data is acquired, the host 2 performs the dictionary decoding on the format conversion data.

The fifth embodiment describes that the output format information for the read command 301 is determined based on the operating state of the information processing system 1 when the read command 301 is stored in the submission queue 2d, but the fifth embodiment does not execute the process of deleting and reissuing (generating) the read command 301 even if the operating state (bus bandwidth usage rate and CPU usage rate) changes after the read command 301 is stored in the submission queue 2d.

As described above, the fifth embodiment determines the output format information determined for each read command issued from the host 2, sequentially storing the read command in the submission queue 2*d* (first queue), and sequentially storing the completion notification indicating that the execution of the read command is completed in the completion queue 2*e* (second queue). In the fifth embodiment, in the dictionary decoding on the format conversion data on the host 2 side is performed when the completion notification indicating that the execution of the read command for which the second output format information is determined has been completed is extracted from the completion queue 2*e*.

According to the above configuration, when the NVMe standard interface is adopted as the interface between the host 2 and the memory system 3, it is possible to realize the effects described in the fourth embodiment and the like described above while properly exchanging the read command using the submission queue 2*d* and the completion queue 2*e*.

Here, the fifth embodiment describes that for example, one submission queue 2*d* is prepared, and the read command (hereinafter, referred to as the read command in the first output format) in which the first output format information is determined and the read command (hereinafter, referred to as the read command in the second output format) in which the second output format information is determined are mixed and stored in the submission queue 2*d*, but may have a configuration in which a plurality of submission queues 2*d* are prepared. Similarly, a plurality of completion queues 2*e* may be prepared.

Hereinafter, the information processing system 1 in the case where two submission queues 2*d* and two completion queues 2*e* are each prepared will be described as a modified example of the fifth embodiment. In the following description, one of the two submission queues 2*d* will be referred to as a first submission queue 2*d*, and the other will be referred to as a second submission queue 2*d*. Further, one of the two completion queues 2*e* is referred to as a first completion queue 2*e*, and the other is referred to as a second completion queue 2*e*.

The fifth embodiment in which one submission queue 2*d* and one completion queue 2*e* are prepared describes that the output format information is determined for the read command based on the operating state of the information processing system 1 when the read command is stored in the submission queue 2*d*, but a modified example of the fifth embodiment may have the configuration in which priorities of each of the first and second submission queues 2*d* and each of the first and second completion queues 2*e* are controlled based on the operating state and the output format information is determined for each read command based on the controlled priority.

In this case, in the modified example of the fifth embodiment, it is assumed that weighted round robin (WRR) control is performed based on the above-described priority.

Here, for example, the case where the bus bandwidth usage rate is less than the above-described first threshold value and the CPU usage rate is less than the above-described second threshold value is assumed. In this case, the priority of the second submission queue 2*d* is controlled to be the same as the priority of the first submission queue 2*d*, for example. Similarly, the priority of the second completion queue 2*e* is controlled to be the same as the priority of the second completion queue 2*e*, for example.

As described above, the operation of the information processing system 1 in the case where the priority of the first submission queue 2*d* and the priority of the second submission queue 2*d* are the same, and the priority of the first completion queue 2*e* and the priority of the second completion queue 2*e* are the same will be schematically described with reference to FIG. 16.

First, the case where the first read command is issued from the host 2 is assumed. In this case, the determination unit 2*c* included in the host 2 has the same priority as the first submission queue 2*d* and the second submission queue 2*d*, so the first output format information is determined for the first read command. In this way, a read command (read command of the first output format) 301*a* for which the first output format information has been determined is stored in the first submission queue 2*d*. That is, in the modified example of the fifth embodiment, the first submission queue 2*d* is used as the submission queue in which the read command 301*a* of the first output format is stored.

Next, the case where the second read command is issued from the host 2 is assumed. In this case, the determination unit 2*c* determines the second output format information for the second read command because the priority of the first submission queue 2*d* and the priority of the second submission queue 2*d* are the same and the first read command is stored in the first submission queue 2*d*. In this way, a read command (read command of the second output format) 301*b* for which the second output format information has been determined is stored in the second submission queue 2*d*. That is, in the modified example of the fifth embodiment, the second submission queue 2*d* is used as the submission queue in which the read command 301*b* of the second output format is stored.

Although detailed description is omitted, the first output format information is determined for the third read command, and the third read command is stored in the first submission queue 2*d* as the read command 301*a* of the first output format. Meanwhile, the second output format information is determined for the fourth read command, and the fourth read command is stored in the second submission queue 2*d* as the read command 301*b* of the second output format.

When the priority of the first submission queue 2*d* and the priority of the second submission queue 2*d* are the same as described above, the read command 301*a* of the first output format and the read command 301*b* of the second output format are alternately stored in the first submission queue 2*d* and the second submission queue 2*d*.

Here, the case where the read command is stored in the first submission queue 2*d* and the second submission queue 2*d* has been described, but the same applies to the case where the read command is extracted by the host interface 4*a*. In this case, the read command 301*a* of the first output format and the read command 301*b* of the second output format may be alternately extracted from the first submission queue 2*d* and the second submission queue 2*d*.

The operation of the memory system 3 after the read command 301*a* of the first output format and the read command 301*b* of the second output format are extracted is as described in the fifth embodiment, and the like, and therefore, a detailed description thereof will be omitted here.

When the read command 301*a* of the first output format is extracted by the host interface 4*a* as described above and the process for the read command 301*a* of the first output format is executed in the memory system 3, the completion notification (hereinafter, referred to as the completion notification of the first output format) 302*a* indicating that the execution of the read command 301*a* of the first output format is completed is stored in the first completion queue 2e. That is, in the modified example of the fifth embodiment, the first completion queue 2e is used as the completion queue in which the completion notification 302a of the first output format is stored.

Meanwhile, when the read command 301b of the second output format is extracted by the host interface 4a and the process for the read command 301b of the second output format is executed in the memory system 3, the completion notification (hereinafter, referred to as the completion notification of the second output format) 302b indicating that the execution of the read command 301b of the second output format is completed is stored in the second completion queue 2e. That is, in the modified example of the fifth embodiment, the second completion queue 2e is used as the completion queue in which the completion notification 302b of the second output format is stored.

Next, the host 2 extracts the completion notification from the first and second completion queues 2e based on the priority of the first completion queue 2e and the priority of the second completion queue 2e.

Specifically, when the priority of the first completion queue 2e and the priority of the second completion queue 2e are the same as described above, the host 2 extracts the completion notification 302a of the first output format from the first completion queue 2e as the first completion notification and extracts the completion notification 302b of the second output format from the second completion queue 2e as the second completion notification. Similarly, the host 2 extracts the completion notification 302a of the first output format from the first completion queue 2e as the third completion notification, and extracts the completion notification 302b of the second output format from the second completion queue 2e as the fourth completion notification.

When the priority of the first completion queue 2e and the priority of the second completion queue 2e are the same as described above, the completion notification 302a of the first output format and the completion notification 302b of the second output format are alternately extracted from the first completion queue 2e and the second completion queue 2e.

The operation of the host 2 after the completion notification 302a of the first output format and the completion notification 302b of the second output format are extracted is as described in the fifth embodiment, and the like, and therefore, a detailed description thereof will be omitted here.

Here, for example, the case where the bus bandwidth usage rate changes to the first threshold value or greater is assumed. In this case, it is necessary to reduce the system bus bandwidth usage rate (that is, reduce the amount of data transmitted from the memory system 3 to the host 2). Therefore, the priority of the second submission queue 2d is controlled to be higher than the priority of the first submission queue 2d, and the priority of the second completion queue 2e is controlled to be higher than the priority of the first completion queue 2e.

Figure 17:
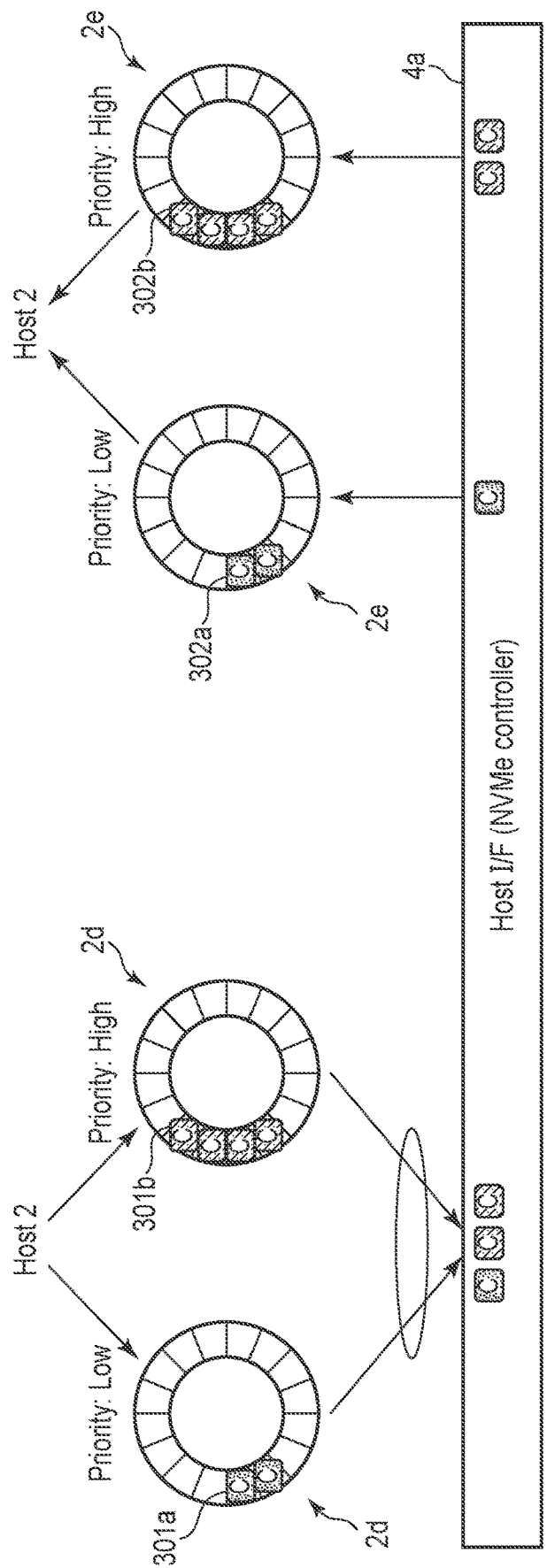
FIG. 17 is a diagram for describing a modified example of the fifth embodiment.

As described above, the operation of the information processing system 1 in the case where the priority of the second submission queue 2d is higher than the priority of the first submission queue 2d, and the priority of the second completion queue 2e is higher than the priority of the first completion queue 2e is schematically described with reference to FIG. 17.

First, the case where the first read command is issued from the host 2 is assumed. In this case, since the priority of the second submission queue 2d is higher than the priority of the first submission queue 2d, the determination unit 2c included in the host 2 determines the second output format information for the first read command. In this way, a read command (read command of the second output format) 301b for which the second output format information has been determined is stored in the second submission queue 2d.

Next, the case where the second read command is issued from the host 2 is assumed. In this case, since the priority of the second submission queue 2d is higher than the priority of the first submission queue 2d, the determination unit 2c determines the second output format information for the second read command. In this way, a read command (read command of the second output format) 301b for which the second output format information has been determined is stored in the second submission queue 2d.

Next, the case where the third read command is issued from the host 2 is assumed. In this case, since the first read command and the second read command are stored in the second submission queue 2d as the read command 301b of the second output format, the determination unit 2c determines the first output format information for the third read command. In this way, a read command (read command of the first output format) 301a for which the first output format information has been determined is stored in the first submission queue 2d.

Although the detailed description is omitted, the second output format information is determined for the fourth and fifth read commands, and the fourth and fifth read commands are stored in the second submission queue 2d as the read command 301b of the second output format. Meanwhile, the first output format information is determined for the sixth read command, and the sixth read command is stored in the first submission queue 2d as the read command 301a of the first output format.

When the priority of the second submission queue 2d is higher than the priority of the first submission queue 2d as described above, the read command 301a of the first output format and the read command 301b of the second output format are stored in the first submission queue 2d and the second submission queue 2d at, for example, a ratio like 1 to 2. In the case of the configuration in which the read command is stored in the second submission queue 2d at a higher frequency than the first submission queue 2d having a lower priority, the number (ratio) of read commands stored in the first submission queue 2d and the second submission queue 2d or the order of the read commands may be changed as appropriate.

Here, the case where the read command is stored in the first submission queue 2d and the second submission queue 2d has been described, but the same applies to the case where the read command is extracted by the host interface 4a. In this case, the read command 301a of the first output format and the read command 301b of the second output format may be alternately extracted from the first submission queue 2d and the second submission queue 2d at, for example, a ratio like 1 to 2.

As described in FIG. 16 above, when the read command 301a of the first output format is extracted, the completion notification 302a of the first output format is stored in the first completion queue 2e, and when the read command 301b of the second output format is extracted, the completion notification 302b of the second output format is stored in the second completion queue 2e.

Next, the host 2 extracts the completion notification from the first and second completion queues 2e based on the priority of the first completion queue 2e and the priority of the second completion queue 2e.

Specifically, when the priority of the second completion queue 2e is higher than the priority of the first completion queue 2e, the host 2 extracts the completion notification 302b of the second output format from the second completion queue 2e as the first and second completion notifications and extracts the completion notification 302a of the first output format from the first completion queue 2e as the third completion notification. Similarly, the host 2 extracts the completion notification 302b of the second output format from the second completion queue 2e as the fourth and fifth completion notifications, and extracts the completion notification 302a of the first output format from the first completion queue 2e as the sixth completion notification.

As described above, when the priority of the second completion queue 2e is higher than the priority of the first completion queue 2e, the completion notification 302a of the first output format and the completion notification 302b of the second output format are extracted from the first completion queue 2e and the second completion queue 2e as, for example, a ratio like 1 to 2. In the configuration in which the completion notification is read from the second completion queue 2e having high priority at a higher frequency than the first completion queue 2e having a lower priority, the number (ratio) of completion notifications extracted from the first completion queue 2e and the second completion queue 2e or the order of the completion notifications may be changed as appropriate.

Here, the case where the bus bandwidth usage rate changes above the first threshold value has been described. However, for example, when the CPU usage rate changes above the second threshold value, in order to reduce the CPU usage rate (that is, suppress the CPU load), the priority of the first submission queue 2d is controlled to be higher than the priority of the second submission queue 2d, and the priority of the first completion queue 2e may be controlled to be higher than the priority of the second completion queue 2e. Since the operation of the information processing system 1 in this case is as described above, a detailed description thereof will be omitted here.

Although the detailed description is omitted, the priorities of the first and second submission queues 2d and the priorities of the first and second completion queues 2e may be adjusted in consideration of the above-described bus bandwidth usage rate and CPU usage rate comprehensively.

Further, here, the case where the priority of the second submission queue 2d with respect to the priority of the first submission queue 2d and the priority of the second completion queue 2e with respect to the priority of the first completion queue 2e are the same is described above, but the priority of the second submission queue 2d with respect to the priority of the first submission queue 2d and the priority of the second completion queue 2e with respect to the priority of the first completion queue 2e may be different. Specifically, for example, the priority of the first submission queue 2d and the priority of the second submission queue 2d are the same, but the priority of the second completion queue 2e may be higher than the priority of the first completion queue 2e.

Further, here, it is described that the storage (submission) of the read commands for the first and second submission queues 2d and the extraction of the read commands from the first and second submission queues 2d are performed based on the same priority. However, the storage of the read command and the extraction of the read command may be performed based on different priorities.

Further, although the configuration in which both the priority of the first and second submission queues 2d and the priority of the first and second completion queues 2e are controlled has been described here, only one of the priority of the first and second submission queues 2d and the priority of the first and second completion queues 2e may be controlled.

As described above, in the modified example of the fifth embodiment, the host 2 has the first and second submission queues 2d (first and second queues) and the first and second completion queues 2e (third and fourth queues), and when the completion notification of the first output format is extracted from the first completion queue 2e, the dictionary decoding is not performed, and when the completion notification stored in the second completion queue 2e is extracted, the dictionary decoding is performed.

Further, in the modified example of the fifth embodiment, the priority of the first and second submission queues 2d is controlled based on the operating state of the information processing system 1, and the output format information for each read command is determined based on the priority (that is, each read command is stored in the first and second submission queues 2d based on the priority). Further, the read commands stored in the first and second submission queues 2d are sequentially extracted and executed based on the priority of the first and second submission queues 2d.

For example, when the CPU usage rate is equal to or greater than the first threshold value, the priority of the first submission queue 2d is controlled to be higher than the priority of the second submission queue 2d. In addition, for example, when the bus bandwidth usage rate is equal to or greater than the second threshold value, the priority of the second submission queue 2d is controlled to be higher than the priority of the first submission queue 2d.

Here, the first and second submission queues 2d have been described, but the same applies to the first and second completion queues 2e.

In the modified example of the fifth embodiment, with such a configuration, for example, when the bus bandwidth usage rate is high, the frequency that the read command 301b of the second output format is extracted by the memory system 3 (host interface 4a) becomes high, and the format conversion data with a small amount of data is easily output from the memory system 3. Therefore, the bus bandwidth usage rate can be reduced.

On the other hand, for example, when the CPU usage rate is high, the frequency that the read command 301b of the first output format is extracted by the memory system 3 (host interface 4a) becomes high, and the decompressed data that does not require the dictionary decoding is easily output from the memory system 3. Therefore, the CPU usage rate can be reduced.

Here, the fifth embodiment described above (that is, the configuration in which the submission queue 2d and the completion queue 2e are prepared one by one) describes that the output format information on the read command is determined based on the operating state of the information processing system 1 when the read command is stored in the submission queue 2d, but in such as configuration, since the read commands for which the output format information has already been determined are executed in the order in which they are stored in the submission queue 2d, it is not possible to immediately cope with the change in the operating state of the information processing system 1 after the read command is stored in the submission queue 2d.

On the other hand, in the modified example of the fifth embodiment (that is, the configuration in which two submission queues 2d and two completion queues 2e are prepared), even after the read command is stored in the first and second submission queues 2d, by controlling the priority of the first and second submission queues 2d or the first and second completion queues 2e, it is possible to preferentially change the read command or the completion notification extracted from the submission queue 2d or the completion queue 2e. Therefore, even if the operating state of the information processing system 1 such as the bus bandwidth usage rate and the CPU usage rate changes from moment to moment, it is possible to immediately cope with the change with a small amount of processing with the change. As a result, the performance of the information processing system 1 as a whole can be further improved.

Further, in the configuration in which the submission queue 2d and the completion queue 2e are prepared one by one as described in the fifth embodiment described above, for example, there is a need to change the process by confirming the output format information each time the read command and the completion notification are extracted. According to the configuration in which the submission queue 2d and the completion queue 2e are prepared for each output format information as in the modified example of the fifth embodiment, since the output format information can be grasped when the read command and the completion notification are extracted, it is possible to realize more efficient operation.

On the other hand, the configuration of the fifth embodiment described above has an advantage that the memory area for realizing the submission queue 2d and the completion queue 2e can be reduced as compared with the configuration of the modified example of the fifth embodiment.

In the modified example of the fifth embodiment, the configuration in which the first submission queue 2d, the second submission queue 2d, the first completion queue 2e, and the second completion queue 2e are each prepared one by one has been described, but at least one of the first submission queue 2d, the second submission queue 2d, the first completion queue 2e, and the second completion queue 2e may be prepared in plural. Further, for example, when a plurality of first submission queues 2d are prepared, the priorities of each of the plurality of first submission queues 2d may be controlled to be the same or may be controlled to be different. The same applies even when a plurality of second submission queues 2d, first completion queue 2e, or second completion queue 2e are prepared. With such a configuration, it is possible to more flexibly cope with the change in the operating state of the information processing system 1 described above.

Further, a modified example of the fifth embodiment may have a configuration in which the host 2 includes two submission queues 2d (first and second submission queues 2d) and one completion queue 2e, a configuration in which the host 2 has one submission queue 2d and two completion queues 2e (first and second completion queues 2e), or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, comprising:
   a first compression unit configured to output second data obtained by compressing first data by a first compression method, the first data being specified by a write command from the host;
   a second compression unit configured to output third data obtained by compressing second data output from the first compression unit by a second compression method different from the first compression method;
   a non-volatile memory to which fourth data based on the third data output from the second compression unit is written;
   a first decoding unit configured to decode the third data based on the fourth data written to the non-volatile memory to the second data;
   a conversion unit configured to acquire fifth data by converting a format of the second data decoded by the first decoding unit, the fifth data being different from the first data; and
   an output unit configured to output the fifth data to the host, wherein
   the host is configured to decode the output fifth data to the first data by a first decompression method, the first decompression method corresponding to the first compression method.

2. The memory system according to claim 1, wherein the second compression method includes entropy coding in which a code corresponding to an appearance frequency of the second data is allocated to the second data.

3. The memory system according to claim 1, wherein the first compression method includes dictionary coding in which sixth data is searched for, the sixth data at least partially matching the first data from a first buffer in which sixth data that is set to a compression target by the first compression method in the past is stored, when the sixth data is found, match information including a match position indicating a position of the sixth data in the first buffer and a match length indicating a length where the first data and the sixth data matches is output as the second data, and when the sixth data is not found, mismatch information including the first data is output as the second data.

4. The memory system according to claim 3, wherein the conversion unit acquires the fifth data in which additional information regarding the match information and the mismatch information is added to the second data.

5. The memory system according to claim 4, wherein the additional information includes information on the length of the match information included in the second data.

6. The memory system according to claim 5, wherein the fifth data includes a stream in which the information on the length of the match information is followed by the match information.

7. The memory system according to claim 4, wherein
   the conversion unit comprises a second buffer,
   the additional information includes information on the number of consecutive pieces of mismatch information included in the second data, and
   the information on the number of consecutive pieces of mismatch information is acquired by storing the consecutive pieces of mismatch information in the second buffer.

8. The memory system according to claim 7, wherein the fifth data includes a stream in which the number of consecutive pieces of mismatch information is followed by the consecutive pieces of mismatch information.

9. The memory system according to claim 1, further comprising:
a second decoding unit configured to decode the second data decoded by the first decoding unit to the first data;
a register configured to store output format information indicating an output format from the memory system; and
a selector configured to select one of the first data decoded by the second decoding unit and the fifth data based on the output format information stored in the register,
wherein the output unit is configured to output the first data or the fifth data selected by the selector to the host.

10. The memory system according to claim 9, wherein the output format information stored in the register is specified when the memory system is started or specified for each read command issued from the host.

11. The memory system according to claim 9, wherein
the second decoding unit comprises a third buffer used to decode the second data to the first data, and
the conversion unit is configured to acquire the information on the number of consecutive pieces of mismatch information by storing the mismatch information included in the second data in the third buffer.

12. An information processing system, comprising:
the memory system according to claim 1; and
the host,
wherein the host comprises a third decoding unit configured to decode the fifth data to the first data when the fifth data is output by the output unit.

13. The information processing system according to claim 12, wherein
the host comprises:
a monitoring unit configured to monitor an operating state of the information processing system; and
a determination unit configured to determine output format information indicating an output format from the memory system based on the operating state,
the determined output format information is stored in a register included in the memory system, and
the output unit is configured to output one of the first data and the fifth data selected by a selector included in the memory system based on the output format information stored in the register.

14. The information processing system according to claim 13, wherein the operating state of the information processing system includes a usage rate of each of one or more CPUs in the host and a bus bandwidth usage rate of each of one or more buses used for communication between the memory system and the host.

15. The information processing system according to claim 14, wherein the determination unit is configured to determine first output format information indicating that the first data is output from the memory system when the usage rate of the CPU is equal to or greater than a value and determine second output format information indicating that the fifth data is output from the memory system when the bus bandwidth usage rate is equal to or greater than a value.

16. The information processing system according to claim 15, wherein the determination unit is configured to determine the first or second output format information for each read command issued from the host.

17. The information processing system according to claim 16, wherein
the host further comprises:
a first queue configured to store the read command for which the first or second output format information is determined; and a second queue configured to store a completion notification indicating that an execution of the read command stored in the first queue is completed,
the third decoding unit is configured to decode the fifth data output from the memory system by executing the read command to the first data when the completion notification indicating that the execution of the read command for which the second output format information is determined is completed is extracted from the second queue.

18. The information processing system of claim 16, wherein
the host further comprises:
a first queue configured to store the read command for which the first output format information is determined;
a second queue configured to store the read command for which the second output format information is determined;
a third queue configured to store a completion notification indicating that an execution of the read command stored in the first queue is completed; and
a fourth queue configured to store a completion notification indicating that an execution of the read command stored in the second queue is completed, and
the third decoding unit is configured to decode the fifth data output from the memory system by executing the read command to the first data when the completion notification indicating that the execution of the read command stored in the second queue is completed is extracted from the fourth queue.

19. The information processing system according to claim 18, wherein
priorities of the first and second queues are controlled based on an operating state of the information processing system,
the determination unit is configured to determine the first or second output format information for each read command issued from the host based on the priorities of the first and second queues, and
the read commands stored in the first and second queues are executed based on the priorities of the first and second queues.

20. The information processing system according to claim 19, wherein
the priority of the first queue is controlled to be higher than that of the second queue when the usage rate of the CPU in the host included in the operating state of the information processing system is equal to or greater than a value, and
the priority of the second queue is controlled to be higher than that of the first queue when the bandwidth usage rate of the bus arranged between the memory system and the host is equal to or greater than a value.

21. The information processing system according to claim 18, wherein
priorities of the third and fourth queues are controlled based on the operating state of the information processing system, and
the completion notifications stored in the third and fourth queues are extracted based on the priorities of the third and fourth queues.

22. The information processing system according to claim 21, wherein
the priority of the third queue is controlled to be higher than that of the fourth queue when the usage rate of the CPU in the host included in the operating state of the information processing system is equal to or greater than a value, and the priority of the fourth queue is controlled to be higher than that of the third queue when the bandwidth usage rate of the bus arranged between the memory system and the host is equal to or greater than a value.

23. The information processing system according to claim 18, wherein at least one of the first to fourth queues is prepared in plural.

* * * * *